(12) United States Patent
Wang et al.

(10) Patent No.: US 11,450,472 B2
(45) Date of Patent: Sep. 20, 2022

(54) ELECTROMAGNETIC DEVICE AND METHOD FOR MANUFACTURING THE SAME

(71) Applicant: SHENNAN CIRCUITS CO., LTD., Shenzhen (CN)

(72) Inventors: Beilei Wang, Shenzhen (CN); Weijing Guo, Shenzhen (CN); Yuhua Zeng, Shenzhen (CN); Hua Miao, Shenzhen (CN); Zhanhao Xie, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 756 days.

(21) Appl. No.: 16/442,562

(22) Filed: Jun. 17, 2019

(65) Prior Publication Data

US 2019/0333681 A1 Oct. 31, 2019

Related U.S. Application Data

(63) Continuation of application No. PCT/CN2018/087824, filed on May 22, 2018.

(30) Foreign Application Priority Data

Apr. 29, 2018 (CN) .......................... 201810405240.8

(51) Int. Cl.
*H01F 27/24* (2006.01)
*H05K 1/11* (2006.01)
(Continued)

(52) U.S. Cl.
CPC .......... *H01F 27/2804* (2013.01); *H01F 27/24* (2013.01); *H01F 41/041* (2013.01);
(Continued)

(58) Field of Classification Search
CPC ..... H01F 27/24; H01F 27/2804; H05K 1/115; H05K 1/024; H05K 1/165; H05K 3/06; H05K 3/424
See application file for complete search history.

(56) References Cited

U.S. PATENT DOCUMENTS

2005/0212642 A1 9/2005 Pleskach et al.
2016/0111966 A1 4/2016 Wang et al.

FOREIGN PATENT DOCUMENTS

| CN | 103943306 A | 7/2014 |
| CN | 208141988 U | 11/2018 |
| JP | 2011114033 A | 6/2011 |

*Primary Examiner* — Jeremy C Norris

(57) ABSTRACT

An electromagnetic device and a method for manufacturing the same are disclosed. The electromagnetic device includes a base plate, a magnetic core, multiple transmission units, and connection layers. The base plate includes a central part defining multiple inner via holes and a peripheral part defining multiple outer via holes. An annular accommodating groove is defined between the central part and the peripheral part. The magnetic core is received in the annular accommodating groove. Transmission units are located on both sides of the base plate. Each transmission unit includes a transmission wire layer including multiple conductive wire patterns, and each conductive wire pattern bridges one inner via hole and one outer via hole. Each of the connection layers is set on one side of the transmission wire layer close to the base plate. At least one connection layer has a dielectric loss no larger than 0.02.

20 Claims, 11 Drawing Sheets

(51) Int. Cl.
*H05K 3/00* (2006.01)
*H01F 27/28* (2006.01)
*H05K 1/02* (2006.01)
*H01F 41/04* (2006.01)
*H05K 1/16* (2006.01)
*H05K 3/06* (2006.01)
*H05K 3/42* (2006.01)

(52) U.S. Cl.
CPC .............. *H05K 1/024* (2013.01); *H05K 1/115* (2013.01); *H05K 1/165* (2013.01); *H05K 3/06* (2013.01); *H05K 3/424* (2013.01); *H01F 2027/2809* (2013.01); *H05K 2203/0723* (2013.01)

ELECTROMAGNETIC DEVICE AND METHOD FOR MANUFACTURING THE SAME

CROSS-REFERENCE TO RELATED APPLICATIONS

The present application is a continuation-application of International (PCT) Patent Application No. PCT/CN2018/087824, filed on May 22, 2018, which claims foreign priority of Chinese Patent Application No. 201810405240.8, filed on Apr. 29, 2018, the contents of all of which are hereby incorporated by reference.

TECHNICAL FIELD

The present disclosure relates to integrated circuit technology and in particular to an electromagnetic device and a method for manufacturing the same.

BACKGROUND

A transformer is composed by a magnetic core and a coil. A coil may have two or more than two windings, in which the one connected to the power is called input winding and the other is called coupling winding. The transformer may transfer electrical energy such as voltage, current between two circuits.

Nowadays, with the development of the transformer, the magnetic core of a transformer may be embedded in a printed circuit board (PCB). A wiring layer may be set on both sides of the PCB so as to form the input coil and the coupling coil. However, due to the space limit on the PCB, the coupling degree of the input coil and the coupling coil of the transformer is also limited, which leads to an inferior performance of the transformer. Furthermore, this kind of transformers usually have low integration level. Thus, problems often occurs that there may be not enough space for installing the transformer.

Besides, high signal transmission loss during signal transmission is also a problem for existing electromagnetic devices such as transformers.

SUMMARY OF THE INVENTION

The present disclosure provides an electromagnetic device and a method for manufacturing the same so as to solve the high signal transmission loss problem during signal transmission of existing electromagnetic devices such as transformers.

To solve the above-mentioned technical problems, one technical solution adopted by the present disclosure is to provide an electromagnetic device. The electromagnetic device includes: a base plate comprising: a central part defining a plurality of inner via holes each running through the base plate; and a peripheral part defining a plurality of outer via holes each running through the base plate; wherein an annular accommodating groove is defined between the central part and the peripheral part; a magnetic core received in the annular accommodating groove; a plurality of transmission units, wherein on each side of the base plate is arranged at least one of the plurality of transmission units, and each of the plurality of transmission units comprises: a transmission wire layer comprising a plurality of conductive wire patterns, wherein the plurality of conductive wire patterns are spaced apart and arranged along a circumferential direction of the annular accommodating groove, each of the plurality of conductive wire patterns bridges one of the plurality of inner via holes and a corresponding one of the plurality of outer via holes; and a connection layer disposed on a side of the transmission wire layer close to the base plate, and configured to fix the transmission wire layer; a plurality of conductive parts set within the plurality of inner via holes and the plurality of outer via holes, and configured to connect the plurality of conductive wire patterns of the plurality of transmission units on two sides of the base plate so as to form a coil circuit capable of transmitting current around the magnetic core wherein a dielectric loss of the connection layer of at least one of the plurality of transmission units is less than or equal to 0.02.

To solve the above-mentioned technical problems, another technical solution adopted by the present disclosure is to provide an electromagnetic device. The electromagnetic device includes: a central part defining a plurality of inner via holes passing therethrough; and a peripheral part defining a plurality of outer via holes passing therethrough; wherein an annular accommodating groove is defined between the central part and the peripheral part; a magnetic core received in the annular accommodating groove; a plurality of conductive parts set respectively within the plurality of inner via holes and the plurality of outer via holes; two input line layers disposed on two opposite sides of the base plate, wherein the two input lines comprises a plurality of input lines connected in order by corresponding ones of the plurality of conductive parts to form an input coil around the magnetic core; two coupling line layers disposed on the two opposite sides of the base plate, wherein the two coupling line layers comprises a plurality of coupling lines connected in order by corresponding ones of the plurality of conductive parts to form a coupling coil around the magnetic core; and two first connection layers each set between a respective one of the two input line layers and a respective one of the two coupling line layers, wherein a dielectric loss of each of the two first connection layers is no more than 0.02; wherein the two input line layers are located farther from the base plate compared with the two coupling line layers, or the two input line layers are located closer to the base plate compared with the two coupling line layers; and the respective one of the two input line layers and the respective one of the two coupling line layers are attached together by a respective one of the two first connection layers.

To solve the above-mentioned technical problems, another technical solution adopted by the present disclosure is to provide a method for manufacturing an electromagnetic device. The method includes: providing a base plate, and defining an annular accommodating groove on the base plate to divide the base plate into a central part and a peripheral part; embedding a magnetic core into the annular accommodating groove; forming two connection layers respectively on two opposite sides of the base plate, wherein a dielectric loss of at least one of the two connection layers is no more than 0.02; attaching two conductive plates respectively on the two connection layers; forming a plurality of inner via holes corresponding to a location of the central part and forming a plurality of outer via holes corresponding to a location of the peripheral part, wherein each of the plurality of inner via holes and the plurality of outer via holes each passes through the base plate, the two connection layers and the two conductive plates; and transforming the two conductive plates into transmission wire layers comprising a plurality of transmission wire patterns, and forming a plurality of conductive parts respectively in the plurality of inner via holes and the plurality of outer via holes, wherein the plurality of transmission wire patterns are connected in order by the plurality of conductive parts to form a coil circuit capable of transmitting current around the magnetic core.

According to the present disclosure, a connection layer with a dielectric loss less no larger than 0.02 may be employed. Therefore, the signal transmission loss in the transmission wire layers may be reduced.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

The technical solutions in the each embodiment of the present disclosure are clearly and completely described below. It is obvious that the described embodiments are only a part of the embodiments of the present disclosure, but not all of the embodiments. All other embodiments obtained by a person of ordinary skill in the art based on the embodiments of the present disclosure without departing from the inventive scope are within the scope of the present application.

Figure 1:
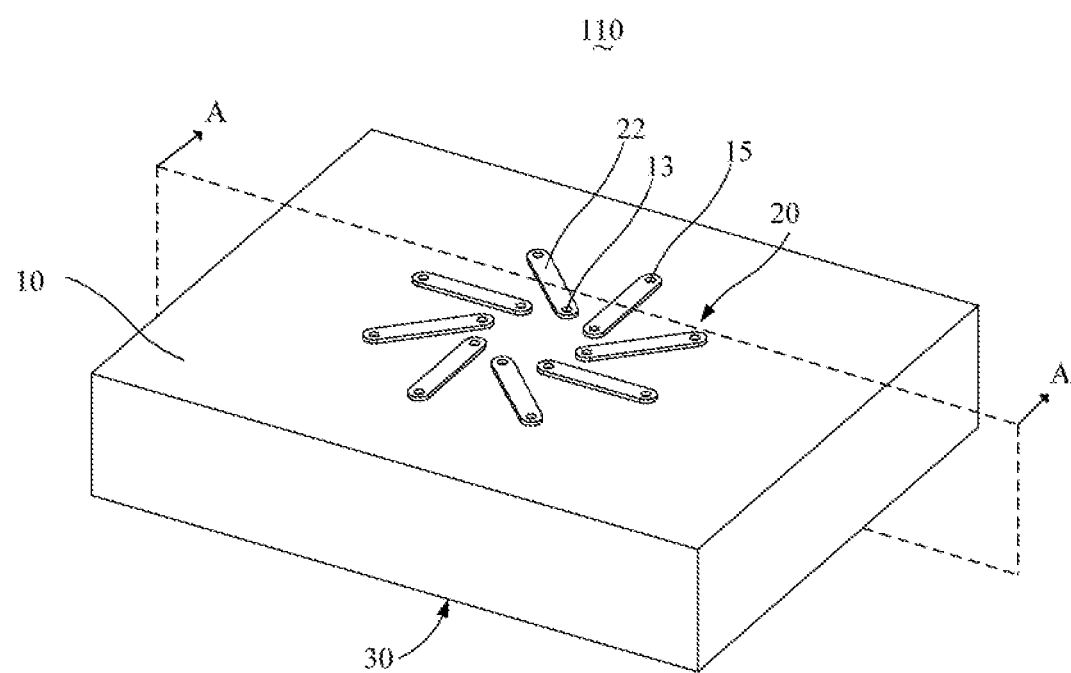
FIG. 1 is a perspective view of an exemplary transformer according to one embodiment of the present disclosure.
Figure 2:
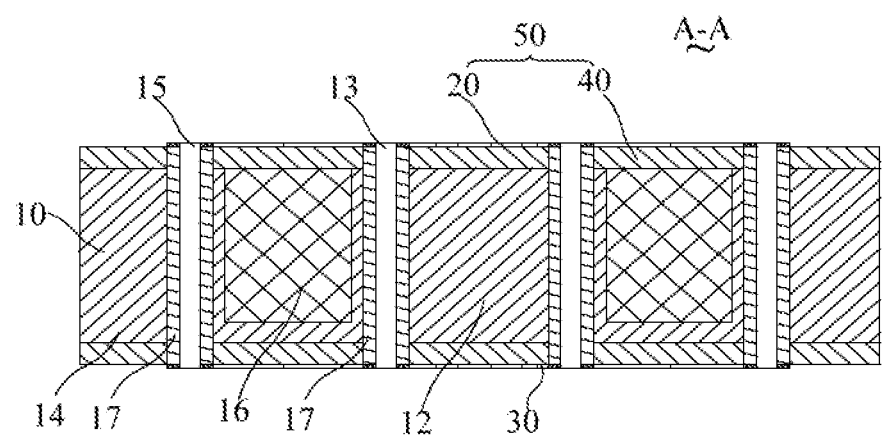
FIG. 2 is a schematic section view of the transformer of FIG. 1 taken along line A-A.

In one aspect, the present disclosure provides a transformer 110. Referring to FIGS. 1 and 2, FIG. 1 is a perspective view of an exemplary transformer according to one embodiment of the present disclosure, and FIG. 2 is a schematic section view of the transformer 110 of FIG. 1 taken along line A-A.

As shown in FIG. 1 and FIG. 2, in this described embodiment, the transformer 110 may generally include a baseplate 10, a magnetic core 16 embedded in the baseplate 10, a number of conductive connectors 17 and two transmission wire layers (including a first transmission wire layer 20 and a second transmission wire layer 30). The two transmission wire layers may be arranged on two opposite sides of the baseplate 10.

In one embodiment, the dielectric loss of the baseplate 10 can be less than or equal to 0.02. Specifically, the material of the baseplate 10 may have high magnetic transmission speed and low magnetic loss, e.g., organic resin. For example, the material of the base plate 10 may be the material of the model TU3863F or TU872SLK of Taiwan Union Technology Corporation, the model M4 or M6 of Panasonic Industrial Devices Materials, the model MW1000 of Nelco Company or the model EM285 of Elite Material Co., Ltd.

In another embodiment, the baseplate 10 also can be made of resin materials. Reinforced material may be immersed in a resin adhesive and then dried, cut and laminated to form the base plate 10.

Figure 3:
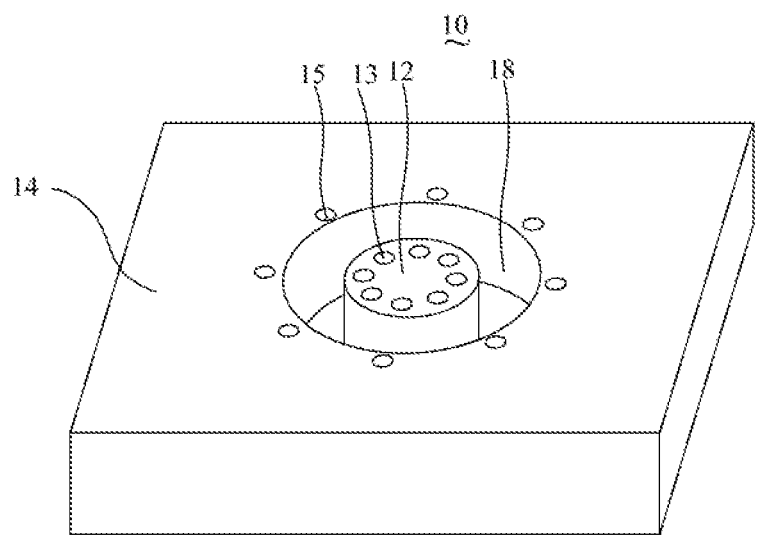
FIG. 3 is a schematic perspective view of the base plate of FIG. 1.

Referring to FIG. 3, the baseplate 10 can include a central part 12 and a peripheral part 14 arranged around the central part 12. An annular accommodating groove 18 may be formed between the central part 12 and the peripheral part 14 of the base plate 10, which may be used to accommodate a magnetic core 16 (shown in FIG. 2).

In this embodiment, the central part 12 and the peripheral part 14 can be an integrated structure, that is, the annular accommodating groove 18 may be arranged at the center of the base plate 10 to divide the base plate 10 into the central part 12 and the peripheral part 14. Certainly, in other embodiments, the central part 12 and the peripheral part 14 can be separate structures. For example, the peripheral part 14 may define a recess at the middle, and the central part 15 may be fixed (e.g., by adhering) in the recess such that a portion of the recess between the central part 15 and the peripheral part 14 may form the annular accommodating groove 18. The top and bottom surfaces of the central part 12 may be substantially flush with those of the peripheral part 14.

In this embodiment, the cross-sectional shape of the annular accommodating groove 18 may be substantially the same as the cross-sectional shape of the magnetic core 16 such that the magnetic core 16 may be easily disposed in the annular accommodating groove 18. The cross-sectional shape of the annular accommodating groove 18 can be annular, square annular, oval and so on; correspondingly the cross-sectional shape of the magnetic core 16 can be annular, square annular, oval and so on.

Referring to FIGS. 1-3, the central part 12 may define multiple inner via holes 13 running through the central part 12. The multiple inner via holes 13 may be disposed adjacent to an outer sidewall of the central part 12, and arranged along the circumferential direction of the central part 12. Correspondingly, the peripheral part 14 may define multiple outer via holes 15 running through the peripheral part 14, and the multiple outer via holes 15 may be arranged adjacent to an inner sidewall of the peripheral part 14.

Further, multiple conductive parts 17 may be respectively set within the inner via holes 13 and the outer via holes 15. The conductive parts 17 may electrically connect the first transmission wire layer 20 and the second transmission wire layer 30 located at two sides of the base plate 10.

In one embodiment, the conductive part 17 can be a metal column, and the diameter of the metal column corresponding to each inner via hole 13 or each outer via hole may be less than or equal to the diameter of the inner via hole 13 or the outer via hole 15. The material of the metal column includes but not limit to copper, aluminum, iron, nickel, gold, silver, platinum group, chromium, magnesium, tungsten, molybdenum, lead, tin, indium, zinc or alloys thereof, etc.

In this embodiment, referring to FIG. 2, a metal layer may be formed on the inner wall of each inner via hole 13 and each outer via hole 15 by means of, for example, electroplating and coating, therefore electrically connecting the transmission wire layers 20 and 30 on the two sides of the base plate 10. The material of the metal layer may be the same as the material of the metal column described in the previous embodiment, and will not be described hereon.

Figure 4:
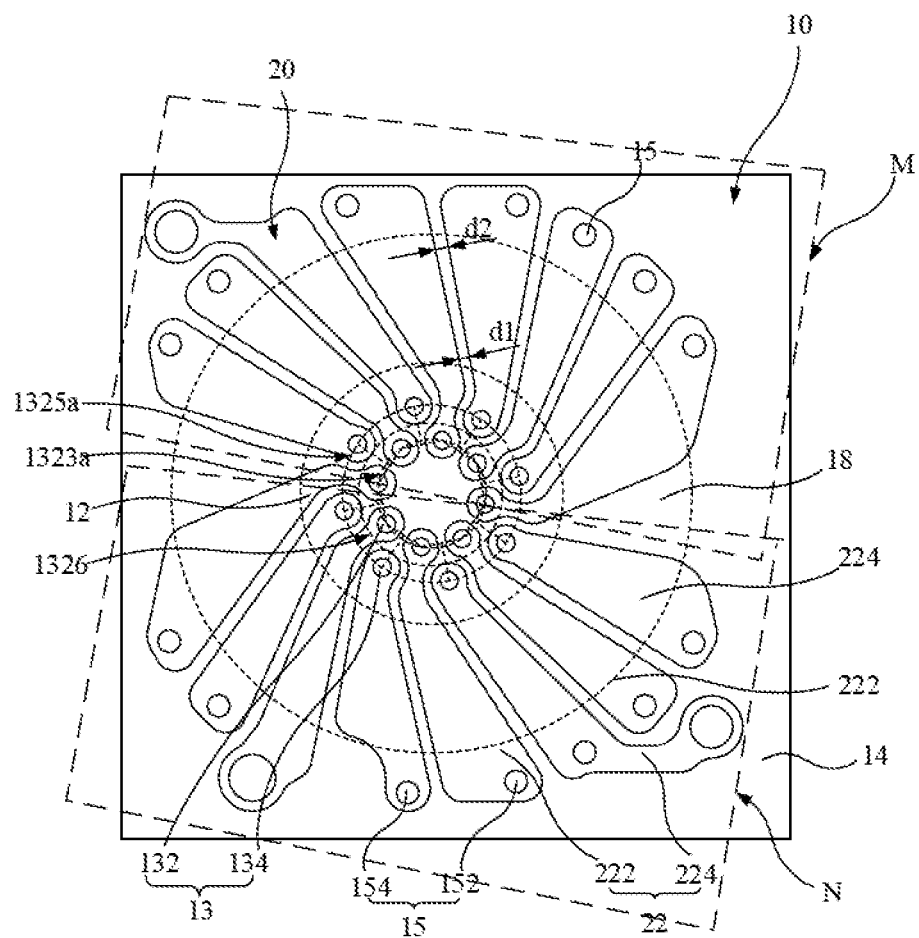
FIG. 4 is a top view of a transformer of one embodiment of the present disclosure.

Referring to FIG. 4, in this embodiment, the multiple inner via holes 13 may include first inner via holes 132 and second inner via holes 134, and the number of the first inner via holes 132 may be the same as the number of the second inner via holes 134. The multiple outer via holes 15 may include first outer via holes 152 and second outer via holes 154.

The center of a first annular track 1323a formed by the center connection line of all the first inner via holes 132 on the same plane may coincide with the center of the second annular track 1325a formed by the center connection line of all the second inner via holes 134, and the first annular track 1323a does not cross with the second annular track 1325a. The first annular track 1323a and the second annular track 1325a can each be a circular track, and also can be an elliptical track or a rectangular track and is not limited in the present disclosure.

When the magnetic core 16 is annular, the first inner via holes 132 and the second inner via holes 134 may have a circular arrangement. That is, the center connection line of all the first inner via holes 132 forms the first circular track while the center connection line of all the second inner via holes 134 forms the second circular track. The center of the first circular track may coincide with the second circular track. In addition, the radius of the second circular track may be larger than the radius of the first circular track. That is, an distance between each second inner via hole 134 and the outside wall of the central part 12 is less than an distance between each first inner via hole 132 and the outside wall of the central part 12.

Further as shown in FIG. 4, in this embodiment, the distances between the center of each of the second inner via hole 134 and the centers of two adjacent first inner via holes 132 may be the same, that is, the center of each second inner via hole 134 may be located on the perpendicular bisector line of the center connection line of the two first inner via holes 132 adjacent to the second inner via hole 134.

In the above described embodiment, there may be two sets of the inner via holes 13 on the central part 12 (the first inner via holes 132 and the second inner via holes 134), and the two tracks respectively formed by the center connection line of the two sets of inner via holes 13 do not cross. Certainly, in other embodiments, there can be at least three sets of the inner via holes 13 on the central part 12. For example, in the embodiment shown in FIG. 6, there are 3 sets of the inner via holes 13 on the central part 12.

Figure 6:
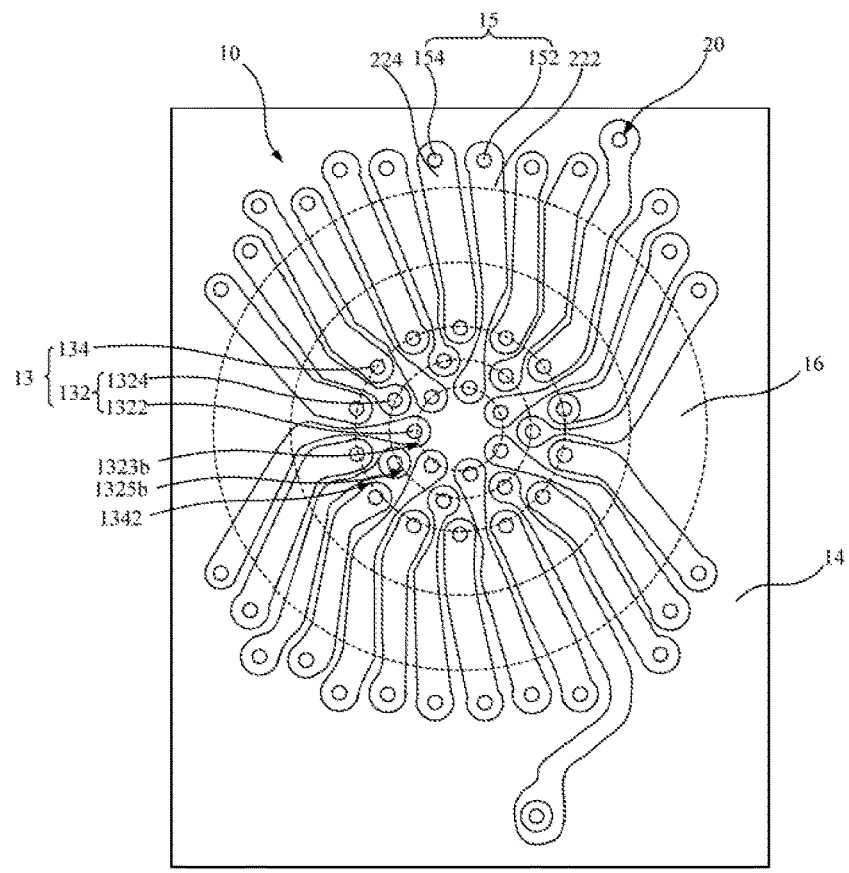
FIG. 6 is a top view of an exemplary transformer according to another embodiment of the present disclosure.

Specifically, referring to FIG. 6, in this embodiment, the first inner via holes 132 may include first sub inner via holes 1322 and second sub inner via holes 1324. The sum of the numbers of the first sub inner via holes 1322 and the second sub inner via holes 1324 may be the same as the number of the second inner via holes 134.

The center connection line of all the first sub inner via holes 1322 may form a first annular track 1323b, the center connection line of all the second sub inner via holes 1324 may form a second annular track 1325b, and the center connection line of all the second inner via holes 134 may form a third annular track 1342. The first annular track 1323b, the second annular track 1325b and the third annular track 1342 may have a same center point but do not cross. The first annular track 1323b, the second annular track 1325b and the third annular track 1342 can be circular tracks, and also can be oval tracks or rectangular tracks, and will not be limited in the present disclosure.

When the magnetic core 16 is circular, the center connection line of all the first sub inner via holes 1322 may form the first circular track, the center connection line of all the second sub inner via holes 1324 may form the second circular track, and the center connection line of all the second inner via holes 134 may form the third circular track. The centers of the first circular track, the second circular track and the third circular may be the same. The radius of the first circular track may be smaller than the radius of the second circular track while the radius of the second circular track is smaller than the radius of the third circular track. That is, the second circular track may be located between the first circular track and the third circular track.

In this embodiment, referring to FIG. 6, all the first sub inner via holes 1322 may be uniformly distributed in the central part 12. The distances between the center of each second sub inner via hole 1324 and the centers of two adjacent first sub inner via holes 1322 may be equal, and the center of each second inner via hole 134 and the centers of two adjacent second sub inner via holes 1324 may be equal. That is, the center of each second sub inner via hole 1324 may be located on the perpendicular bisector of the center connection line between the two adjacent first sub inner via holes 1322, and the center of each second inner via hole 134 may be located on the perpendicular bisector of the center connection line between the two adjacent second sub inner via holes 1324.

In the above described embodiment, the above-described arrangement of the first sub inner via holes 1322 and the second sub inner via holes 1324 not only makes the inner via holes 13 on the central part 12 uniformly distributed, but also allows the central part 12 to define more inner via holes 13. Thus, the number of input lines 222 and coupling lines 224 of the transformer 110 may be increased, therefore improving the coupling performance of the transformer 110.

Certainly, more inner via holes 13 can also be arranged on the central part 12 by the method of reducing the diameter of the inner via hole 13. However, if the diameter of the inner via hole 13 is too small, it needs very high machining accuracy which leads to a high product processing cost. If the diameter of the inner via hole 13 is too large, the number of inner via holes 13 on central part 12 is limited, as well as the number of the input lines 222 and the coupling lines 224, thus influencing the coupling performance of the transformer 110. Therefore, in this embodiment, the diameter of the inner via hole 13 is about 1.5~3.1 mm (millimeter).

Referring to FIG. 4 and FIG. 6, the outer via holes 15 may be distributed at the side of the peripheral part 14 close to the magnetic core 16, and the multiple outer via holes 15 may be uniformly distributed.

Specifically, the outer via holes 15 may be distributed at the side close to the magnetic core 16. It is better to have a small distance between the magnetic core 16 and the outer via holes 15. It should be noticed that the distance between the outer via holes 15 and the magnetic core 16 should meet the processing requirements of the outer via holes 15, and it also needs to meet the resistance to electrical breakdown.

In this embodiment, the annular magnetic core 16 can be made by sequentially stacking a number of annular sheets, or be made by winding narrow and long metal material, or be made by sintering a number of metal mixtures. The forming of the magnetic core 16 may be achieved in different ways and is not limited in the present disclosure.

The magnetic core 16 can be an iron core, or can be made of other magnetic metal oxide, such as Manganese-zinc ferrite and Nickel-zinc ferrite etc. Manganese-zinc ferrite has characteristics such as high permeability, high magnetic flux density and low loss, and Nickel-zinc ferrite has characteristics such as high impedance and low permeability. In this embodiment, the magnetic core is made by sintering Manganese-zinc ferrite at high temperature.

Continuing to refer to FIGS. 1-3, the first transmission wire layer 20 and the second transmission wire layer 30 can be made of metal material. The metal material used to form the first transmission wire layer 20 and the second transmission wire layer 30 may include but not limit to copper, aluminum, iron, nickel, gold, silver, platinum group, chromium, magnesium, tungsten, molybdenum, lead, tin, indium, zinc or any alloy thereof etc.

In this embodiment, the metal material of the first transmission wire layer 20 and the second transmission wire layer 30 and the material of the conductive part 17 in the inner via holes 13 and the outer via holes 15 can be the same material. Taking copper as an example, the base plate 10 may be used as cathode, and be placed in a salt solution containing copper ions to be electroplated, which can form the first transmission wire layer 20 and the second transmission wire layer 30 on the two sides of the base plate 10, and at the same time form the conductive parts 17 on the inner wall of each inner via holes 13 and each outer via holes 15.

In another embodiment, the materials of the first transmission wire layer 20 and the second transmission wire layer 30 and the materials of the conductive part 17 in the inner via holes 13 and the outer via holes 15 can be different materials.

In this embodiment, the thickness of the first transmission wire layer 20 and the second transmission wire layer 30 may both be 17~102 μm (micron meter). In one embodiment, in order to arrange more conductive wire patterns 22 on the first transmission wire layer 20 and the second transmission wire layer 30 so as to increase the coupling degree of the transformer 110, the thickness of the first transmission wire layer 20 and the second transmission wire layer 30 can be 17~34 μm. In other embodiments, in order to improve the overflow capacity of the first transmission wire layer 20 and the second transmission wire layer 30, the thickness of the first transmission wire layer 20 and the second transmission wire layer 30 also can be 40~100 μm. Optionally, the thickness of the first transmission wire layer 20 and the second transmission wire layer 30 may be 65~80 μm. This is because when the first transmission wire layer 20 and the second transmission wire layer 30 are etched to form the conductive wire patterns 22, if the thickness is too high (e.g., more than 80 μm) and the distance between two adjacent conductive wire patterns 22 of a same transmission wire layer is too small, the etching may not be complete, thus the two adjacent conductive wire patterns 22 may still be connected which may cause short circuit; if the thickness is too small (e.g., less than 40 μm), the current carrying capacity of the conductive wire patterns 22 may be reduced.

Figure 5:
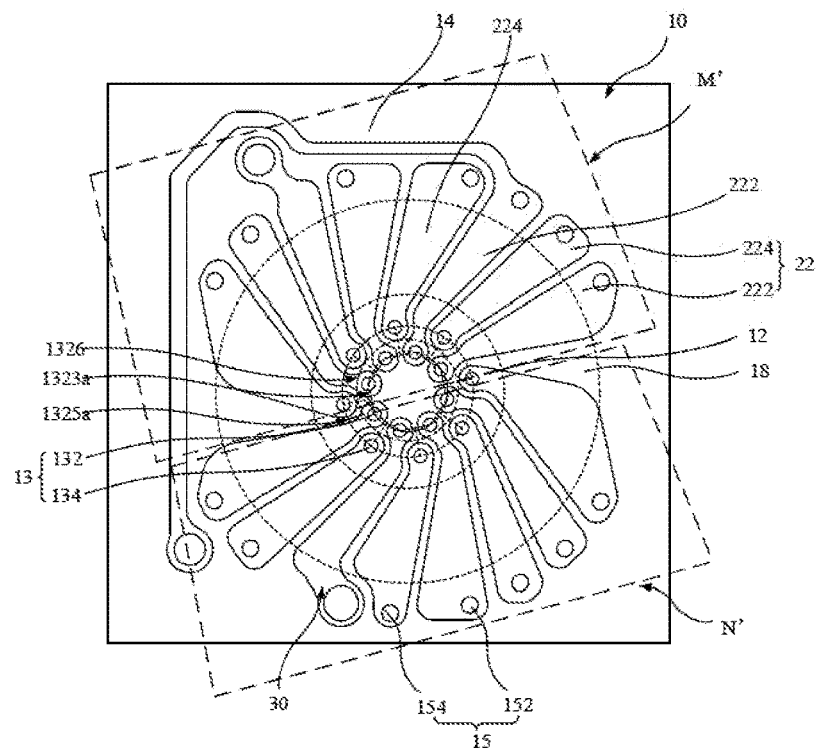
FIG. 5 is a bottom view of the transformer of FIG. 4.

Continuing to refer to FIG. 4 and FIG. 5, both the first transmission wire layer 20 and the second transmission wire layer 30 may include multiple conductive wire patterns 22. Each conductive wire pattern 22 may bridge one inner via hole 13 and one corresponding outer via hole 15. One end of the conductive wire pattern 22 may connect with the conductive part 17 in the inner via hole 13, and the other end of the conductive wire pattern 22 may connect with the conductive part 17 in the outer via hole 15. Therefore, the conductive parts 17 in the inner via holes 13 and the conductive parts 17 in the outer via hole 15 may connect the conductive wire patterns 22 on the first transmission wire layer 20 and the second transmission wire layer 30 in order, thus forming a coil circuit capable of transmitting current around the magnetic core 16.

In an embodiment, the conductive part 17 can be a metal column. The conductive part 17 can be welded with the conductive wire patterns 22 on the first transmission wire layer 20 and the second transmission wire layer 30.

In another embodiment, the conductive part 17 can be metal layer formed by methods such as electroplating and coating on the inner wall of the inner via holes 13 and the outer via holes 15. The metal layer may electrically connect with one conductive wire pattern 22 located at the first transmission wire layer 20 and one conductive wire pattern 22 located at the second transmission wire layer 30.

In another embodiment, the conductive part 17 can be integrally formed with the first transmission wire layer 20 and the second transmission wire layer 30 by electroplating and etching. Then the first transmission wire layer 20 and the second transmission wire layer 30 each including multiple conductive wire patterns may be formed to be integrated with the conductive part 17.

In this embodiment, the above described multiple conductive wire patterns 22 can be formed by etching. Specifically, a metal layer may be firstly formed on both sides of the base plate 10. A masking layer may be formed on the metal layer by exposing and developing. Then etching solution may be applied to the metal layer with the masking layer, and thus a portion of the metal layer which is not covered by the masking layer may be removed. Finally, the masking layer may be removed, and the first transmission line layer 20 and the second transmission line layer 30 may be acquired.

In the embodiment, as shown in FIG. 4 and FIG. 5, the multiple conductive wire patterns 22 on the first transmission wire layer 20 and the second transmission wire layer 30 can be divided as input lines 222 and coupling lines 224. On one transmission wire layer may be arranged both the input lines 222 and the coupling lines 224. Each conductive wire pattern 22 bridging one first inner via hole 132 and one corresponding first outer via hole 152 may be set as the input line 222, and two ends of each input line 222 may be electrically connected respectively with the conductive part 17 in the first inner via holes 132 and the conductive part 17 in the first outer via hole 152. Each conductive wire pattern 22 bridging one second inner via hole 134 and one corresponding second outer via hole 154 may be set as the coupling line 224, and two ends of each coupling line 224 may be electrically connected respectively with the conductive part 17 in the second inner via hole 134 and the conductive part 17 in the second outer via hole 154.

In the above described embodiment, the input line 222 is the conductive wire pattern 22 bridging one first inner via hole 132 and one first outer via hole 152, and the coupling line 224 is the conductive wire pattern 22 bridging one second inner via hole 134 and one second outer via hole 154. Certainly, in other embodiments, the coupling line 224 may alternatively be the conductive wire pattern 22 bridging one first inner via hole 132 and one first outer via hole 152, and the input line 222 may be the conductive wire pattern 22 bridging one second inner via hole 134 and one second outer via hole 154.

In one embodiment, the number of the input lines 222 may be the same as the number of the coupling lines 224. In this circumstance, the turns of the input lines 222 and the turns of the coupling lines 224 are the same in the transformer 110, that is, the turn ratio of the input line 222 to the coupling lines 224 may be 1:1. In another embodiment, the number of the input lines 222 can be different from the number of the coupling lines 224. For example, in another embodiment, the number of the input lines 222 can be half of the number of the coupling lines 224, that is, the turn ratio of the input lines 222 to the coupling lines 224 may be 1:2. In yet another embodiment, the number of the input lines 222 can be twice of the number of the coupling lines 224, that is, the turn ratio of the input lines 222 to the coupling lines 224 may be 2:1. In other words, the turn ratio of the input lines 222 to the coupling lines 224 can be determined according to the actual needs, and will not be limited in the present disclosure.

Further referring to FIG. 4 and FIG. 5, in this embodiment, a first circle 1326 may be defined between the first circular track 1323a and the second circular track 1325a, and the center of the first circle 1326 and the center of the first circular track 1323a may be coincident. That is, the radius of the first circle 1326 may be larger than or equal to the radius of the first circular track 1323a and smaller than or equal to the radius of the second circular track 1325a. The width of any conductive wire pattern 22 at the position of the first circle 1326 may be identical. In other words, in the area between the first circular track 1323a and the second circular track 1325a, the widths of the conductive patterns 22 may be the same. It should be noticed that, any circle with a same center as the first circular track 1323a and the second circular track 1325a and a radius no less than that of the first circular track 1323a and no more than that of the second circular track 1325a may be taken as the first circle 1326.

In this embodiment, as shown in FIG. 4, for at least part of the conductive wire patterns 22 on a same transmission wire layer such as the first transmission wire layer 20 or the second transmission wire layer 30, the farther from the corresponding inner via hole 13 it is, the bigger the width of the conductive wire pattern 22 is. Since the multiple conductive wire patterns 22 are spaced apart and arranged along the circumferential direction of the annular accommodating groove 18, and the width of at least some of the conductive wire patterns 22 may gradually increase along a wiring direction from the inner via holes 13 to the outer via holes 15, the distance between at least some of adjacent conductive wire patterns 22 may keep consistent within the area corresponding to the annular accommodating groove 18.

The distance between adjacent conductive wire patterns 22 may refer to the width of the gap between the adjacent two conductive wire patterns 22.

Furthermore, in this embodiment, as shown in FIG. 4, the input lines 222 and the coupling lines 224 on each same transmission wire layer such as the first transmission wire layer 20 or the second transmission wire layer 30 may be divided into two sets of wire patterns M and N. One of the two sets of wire patterns M and N may be arranged on one half of the baseplate 10 while the other of the two sets of wire patterns M and N may be arranged on another half of the baseplate 10.

Furthermore, the two sets of wire patterns M and N of the first transmission wire layer 20 may be a mirror image of the two sets of wire patterns M' and N' of the second transmission wire layer 30. For example, FIG. 4 shows the wire patterns M and N of the first transmission wire layer 20 seen from one side (e.g., the upper side) of the transformer, and FIG. 5 shows the wire patterns M' and N' of the second transmission wire layer 30 seen from the other side (e.g., the lower side) of the transformer. It can be seen that the wire patterns M and N may be symmetrical to the wire patterns M' and N' in this embodiment.

Furthermore, as shown in FIG. 4 and FIG. 5, in each group wire pattern M and N, the distance of any two adjacent conductive wire patterns 22 (for example, one input line 222 and one adjacent coupling line 224, two adjacent coupling lines 224, or two adjacent input lines 222) may keep consistent within the area corresponding to the annular accommodating groove 18. For example, in FIG. 4, the distances between two adjacent conductive wire patterns 22 in any group wire pattern M or N may be respectively d1 and d2 at different radial positions. As described above, this distance may keep consistent within the area corresponding to the annular accommodating groove 18, that is, d1 may be equal to d2. In this embodiment, the distance between two adjacent conductive wire patterns 22 within the area corresponding to the annular accommodating groove 18 can be 50~150 μm.

It is understood that, the smaller the distance between the two adjacent conductive wire patterns 22 within the area corresponding to the annular accommodating groove 18 is, the higher the coupling degree of the input line 222 and the coupling line 224 becomes. Therefore, the distance between the adjacent conductive wire patterns 22 of the same layer should be kept as small as possible during the formation of the conductive wire patterns 22 of the transmission wire layers 20 and 30. In an embodiment, the distance between the two adjacent conductive wire patterns 22 within the area corresponding to the annular accommodating groove 18 may be the minimum allowable clearance between the two adjacent conductive wire patterns 22, such that the coupling degree may be improved. The minimum allowable clearance is a safe distance between two adjacent conductive wire patterns 22, which may ensure that no high voltage breakdown will occur between adjacent conductive wire patterns 22. Therefore, the service life of the transformer 110 can be extended.

In this embodiment, insulating material may be disposed between each two adjacent conductive wire patterns 22. The insulating material can be polyimide, organic film, ink and so on. In order to improve the voltage capacity between each two adjacent conductive wire patterns 22. The insulating material can be polyimide with high insulation coefficient.

The safe distance between adjacent conductive wire patterns 22 is related to the properties of the insulating material. Therefore, the distance between adjacent conductive wire patterns 22 should be flexibly controlled to be larger than the safe distance based on the characteristics of the selected insulation materials during the formation of the conductive wire patterns 22, thereby avoiding high voltage breakdown which may lead to the damage of the transformer 110.

In this embodiment, the wire patterns M and N on the first transmission wire layer 20 and the wire patterns M' and N' on the second transmission wire layer 30 are arranged around the magnetic core 16. The width of each conductive wire pattern 22 may gradually increase from the corresponding inner via hole 13 to the corresponding outer via hole 15, and the distance between each two adjacent conductive wire patterns 22 may keep consistent within the area corresponding to the annular accommodating groove 18. Thus, the arrangement of the conductive wire patterns 22 on the first transmission wire layer 20 and the second transmission wire layer 30 may be more compact, and the wire patterns M, N, M' or N' consisting of the conductive wire patterns 22 may better cover the magnetic core 16, thereby reducing the leakage inductance and improving the coupling performance of the transformer 110.

In an embodiment, further referring to FIGS. 4-5 and FIGS. 7-8, on a same transmission wire layer (the first transmission wire layer 20 or the second transmission wire layer 30), the input lines 222 may be divided into several input line groups and the coupling lines 224 may be divided into several coupling line groups. Each input line group may consist of at least one input line 222 and each coupling, line group may consist of at least one coupling line 224. The input line groups and the coupling line groups may be alternately arranged along the circumferential direction of the magnetic core 16.

In an embodiment, referring to FIG. 4 and FIG. 5, each input line group may include only one input line 222, and each coupling line group may include only one coupling line 224. The multiple input line groups and the multiple coupling ling groups may be alternately arranged along the circumferential direction of the magnetic core 16. That is, the conductive wire patterns 22 on a same transmission wire layer (the first transmission wire layer 20 or the second transmission wire layer 30) are orderly arranged in the order of the input line 222, the coupling line 224, the input line 222 and the coupling line 224.

Figure 7:
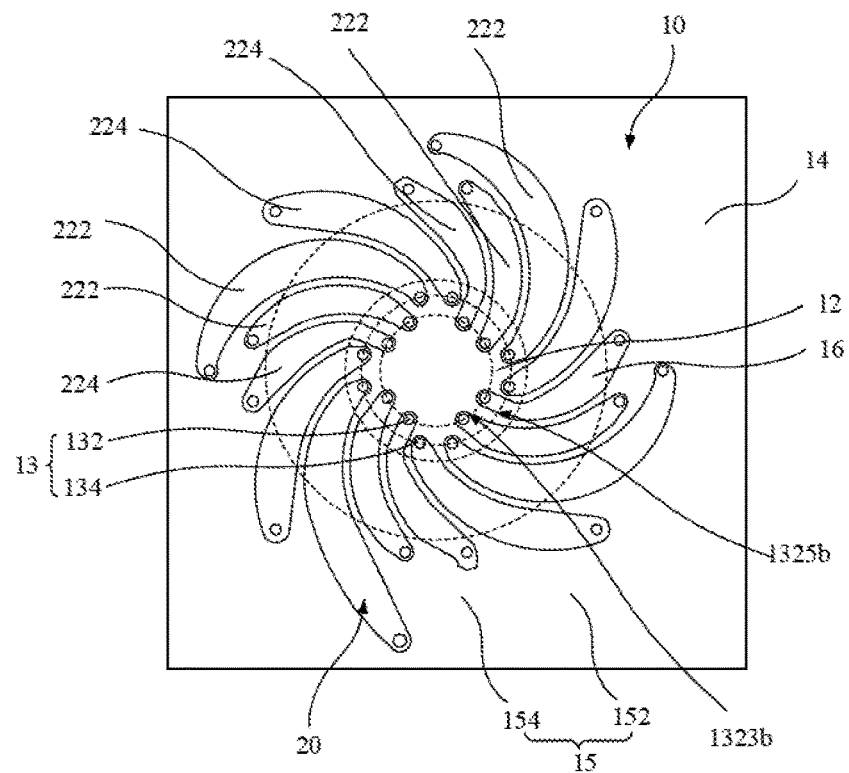
FIG. 7 shows the wire pattern of the first transmission wire layer according to an embodiment of the present disclosure.
Figure 8:
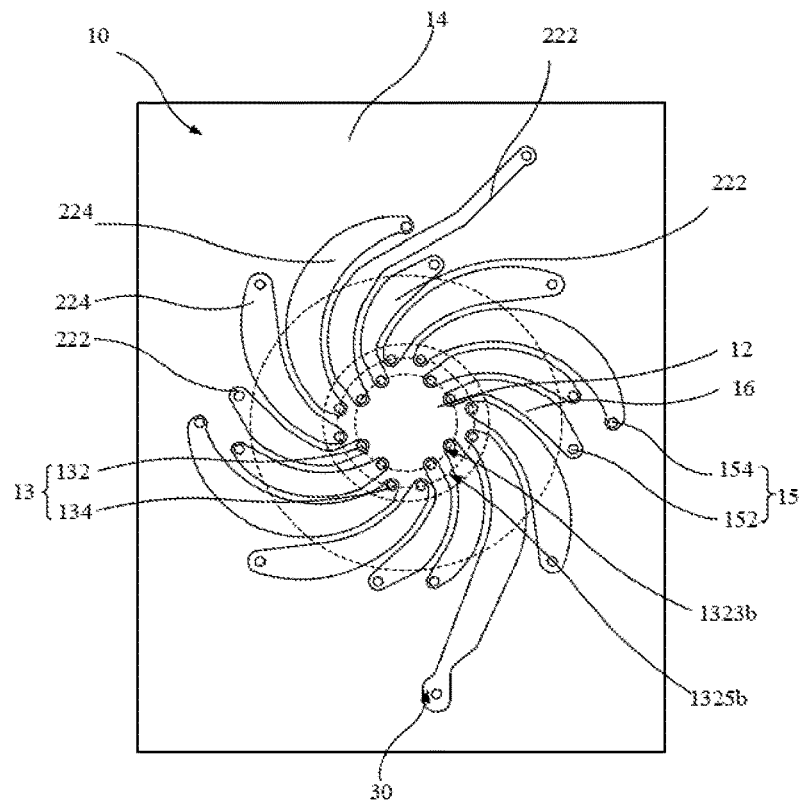
FIG. 8 shows the wire pattern of the second transmission wire layer of the device of FIG. 7.

In another embodiment, referring to FIG. 7 and FIG. 8, each input line group can include two input lines 222, and each coupling line group can include two coupling lines 224. The multiple input line groups and the multiple coupling line groups may be alternately arranged along the circumferential direction of the magnetic core 16. That is, the conductive wire patterns 22 on a same signal transmission wire layer are orderly arranged in the order of two input lines 222, two coupling lines 224, two input lines 222 and two coupling lines 224.

In another embodiment, each input line group can also include at least three consecutively arranged input lines 222, and each coupling line group can also include at least three consecutively arranged coupling lines 224. The multiple input line groups and the multiple coupling line groups may be alternately arranged along the circumferential direction of the magnetic core 16.

In an embodiment, when the number of the input lines 222 is the same as the number of the coupling lines 224, the number of the conductive wire patterns 22 in each input line group can be the same as the number of the conductive wire patterns 22 in each coupling line group. For example, when each of the input line groups and the coupling line groups includes three conductive wire patterns 22, the conductive wire patterns 22 on a same transmission wire layer may be orderly arranged in the order of three input lines 222, three coupling lines 224, three input lines 222 and three coupling lines 224.

In another embodiment, when the number of the input lines 222 is different from the number of the coupling lines 224, the number of the conductive wire patterns 22 in each input line group can be different from the number of the conductive wire patterns 22 in each coupling line group. For example, when the number of the input lines 222 is the half of the number of the coupling lines 224, the number of the conductive wire patterns 22 in each input line group can be the half of the number of the conductive wire patterns 22 in each coupling line group. Supposing that each input line group includes only one conductive wire pattern 22, and each coupling line group includes two conductive wire patterns 22, then the conductive wire patterns 22 on a same transmission wire layer may be orderly arranged in the order of the input line 222, the coupling line 224, the coupling line 224, the input line 222, the coupling line 224 and the coupling line 224.

In this embodiment, because multiple input line groups and multiple coupling line groups on a same transmission wire layer are alternately arranged along the circumferential direction of the magnetic core 16, the distance between the input line 222 and the coupling line 224 may be reduced such that the coupling performance of the transformer 110 may be improved.

In an embodiment, referring to FIG. 1 and FIG. 2, between the first transmission wire layer 20 and the base plate 10, and between the second transmission wire layer 30 and the base plate 10 can respectively be arranged a connection layer 40, which may be used to fix the first transmission wire layer 20 and the second transmission wire layer 30. The first transmission wire layer 20 or the second transmission wire layer 30 together with the corresponding connection layer 40 may form a transmission unit 50. That is, the first transmission wire layer 20 and the connection layer 40 arranged between the first transmission wire layer 20 and the base plate 10 can form a transmission unit 50. The second transmission wire layer 30 and the connection layer 40 arranged between the second transmission wire layer 30 and the base plate 10 also can form a transmission unit 50. In an embodiment, each side of the base plate 10 may include only one transmission unit 50, and the connection layer 40 of the transmission unit 50 may be located between the base plate 10 and the corresponding first transmission wire layer 20 or the corresponding second transmission wire layer 30. The dielectric loss of at least one of the two connection layers 40 may be less than or equal to 0.02.

Specifically, the material of the connection layer 40 may have high magnetic transmission speed and low magnetic loss, and may be organic resin. For example, the material of the connection layer 40 can be the material of the Model TU863F or TU872SLK made by Taiwan Union Technology Corporation, the Model M4 or M6 made by Panasonic Industrial Devices Materials, the Model MW1000 made by Nelco Company or the EM285 made by Elite Material Co., Ltd.

In another embodiment, on any one side of the opposite two sides of the base plate 10 can be arranged at least two stacked transmission units 50. For example, in some embodiments, two first transmission wire layers 20 may be subsequently disposed on one side of the base plate 10. Between the base plate 10 and one of the two first transmission wire layers 20, and between the two first transmission wire layers 20 may be respectively disposed a connection layer 40. In other embodiments, two second transmission wire layers 30 may be disposed on the opposite side of the base plate 10. Between the base plate 10 and one of the two second transmission wire layers 30, and between the two second transmission wire layers may be respectively disposed a connection layer 40. At least one of the connection layers 40 may have a dielectric loss less than or equal to 0.02. In this embodiment, the dielectric loss of the connection layer 40 between two transmission units 50 at the same side of the base plate 10 may be less than or equal to 0.02.

Therefore, by using a connection layer 40 with the dielectric loss less than 0.02 to fix the corresponding, first transmission wire layer 20 and the corresponding second transmission wire layer 30 on the base plate 10, the signal loss during signal transmission in the first transmission wire layer 20 and the second transmission wire layer 30 may be reduced.

In the above described embodiments, the input lines 222 and the coupling lines 224 are set in the same first transmission wire layer 20 or the same second transmission wire layer 30, that is, both the first transmission wire layer 20 and the second transmission wire layer 30 include the input lines 222 and the coupling lines 224. However, in other embodiments, the input lines 222 and the coupling lines 224 can also be arranged in different first transmission wire layers 20 or different second transmission wire layers 30.

Figure 9:
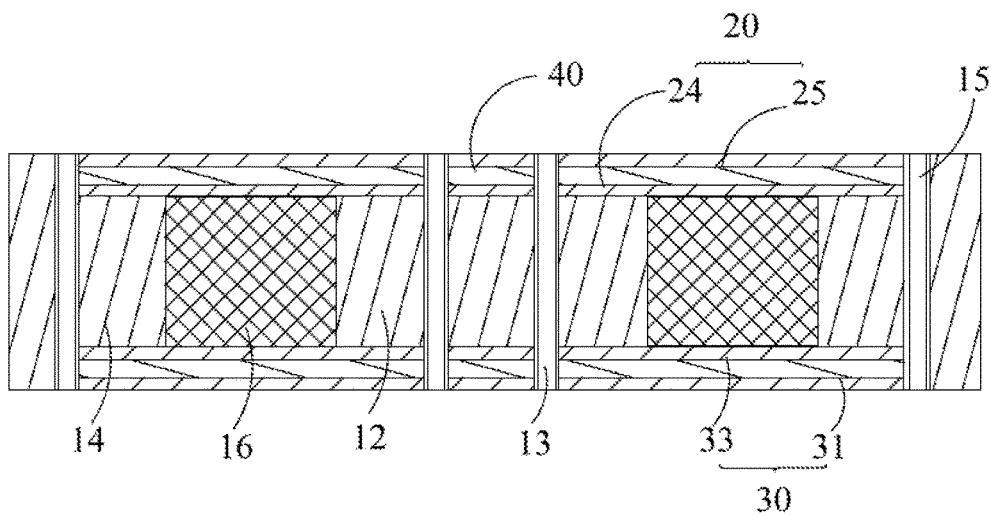
FIG. 9 is a schematic structural view of layering arrangement of input lines and coupling lines according to one embodiment of the present disclosure.

For example, referring to FIG. 9, in another embodiment, the first transmission wire layer 20 can include a first input line layer 24 and a first coupling line layer 25. The second transmission wire layer 30 can also include a second input line layer 31 and a second coupling line layer 33. The first input line layer 24 and the second input line layer 31 may be electrically connected, and the first coupling line layer 25 and the second coupling line layer 33 may be electrically connected. The first input line layer 24 and the first coupling line layer 25 may be stacked together and arranged at one side of the base plate 10 along the axial direction of the inner via hole 13, and. A connection layer 40 may be disposed between the first input line layer 24 and the first coupling line layer 25. The second input line layer 31 and the second coupling line layer 33 may be stacked together and arranged at the opposite side of the base plate 10 along the axial direction of the inner via hole 13. A connection layer 40 may be disposed between the second input line layer 31 and the second coupling line layer 33. The connection layer 40 can be made of insulating adhesive material, e.g., the previous described material with a dielectric loss less than 0.02.

In this embodiment, the first input line layer 24, the second input line layer 31, the first coupling line layer 25 and the second coupling line layer 33 may all include multiple conductive wire patterns (not shown). Each conductive wire pattern of the first input line layer 24 and the second input line layer 31 is an input line while each conductive wire pattern of the first coupling line layer 25 and the second coupling line layer 33 is a coupling line. One input line layer (e.g., the first input line layer 24 or the second input line layer 31) may include multiple input line groups, each of which may consist of at least one input line. Similarly, one coupling line layer (e.g., the first coupling line layer 25 or the second coupling line layer 33) may include multiple coupling line groups, each of which may consist of at least one coupling line. The projections of the multiple input line groups of the first input line layer 24 on the base plate 10 and the projections of the multiple coupling line groups of the first coupling line layer 25 on the base plate 10 may be alternately arranged alone the circumferential direction of the magnetic core 16. Similarly, the projections of the multiple input line groups on the second input line layer 31 on the base plate 10 and the projections of the multiple coupling line groups of the second coupling line layer 33 on the base plate 10 may be alternately arranged along the circumferential direction of the magnetic core 16. The first input line layer 24, the second input line layer 31, the first coupling line layer 25, the second coupling line layer 33 and the base plate 10 can be stacked in a predetermined order. In an embodiment, the stack order may be: the first input line layer 24, the first coupling line layer 25, the base plate 10, the second input line layer 31 and the second coupling line layer 33. In another embodiment, the stack order may be: the first input line layer 24, the first coupling line layer 25, the base plate 10, the second coupling line layer 33 and the first coupling line layer 31. In yet another more embodiment, the stack order may be: the first coupling line layer 25, the first input line layer 24, the base plate 10, the second input line layer 31 and the second coupling line layer 33.

For all kinds of electromagnetic devices, all the conductive wire patterns 22 used for forming the coil can be arranged in layers according to the above described way.

In one embodiment, when each input line group only includes one input line and each coupling line group only includes one coupling line, the projection pattern of the multiple input line groups and the multiple coupling line groups on the base plate 10 may be similar to the wire pattern shown in FIG. 4 and FIG. 5.

In another embodiment, when each input line group includes two input lines and each coupling line group includes two coupling lines, the projection pattern of the multiple input line groups and the multiple coupling line groups on the base plate 10 may be similar to the wire pattern shown in FIG. 7 and FIG. 8.

In another embodiment, the projection of the multiple input line groups of the input line layer 24 on the base plate 10 and the projection of the multiple coupling line groups of the coupling layer 25 on the base plate 10 can also be at least partially overlapped with each other, and the projection of the multiple input line groups of the input line layer 31 on the base plate 10 and the projection of the multiple coupling line groups of the coupling line layer 33 on the base plate 10 may also be at least partially overlapped with each other.

In this embodiment, because the multiple input lines and the multiple coupling lines of the first transmission wire layer 20 and the second transmission wire layer 30 located on the two opposite sides of the base plate 10 are arranged on different layers, the wiring space of the transformer 110 may be increased, and the volume of the conductive wire pattern 22 may also be increased. Therefore, the over current capacity of the transformer 110 may be improved.

Figure 10:
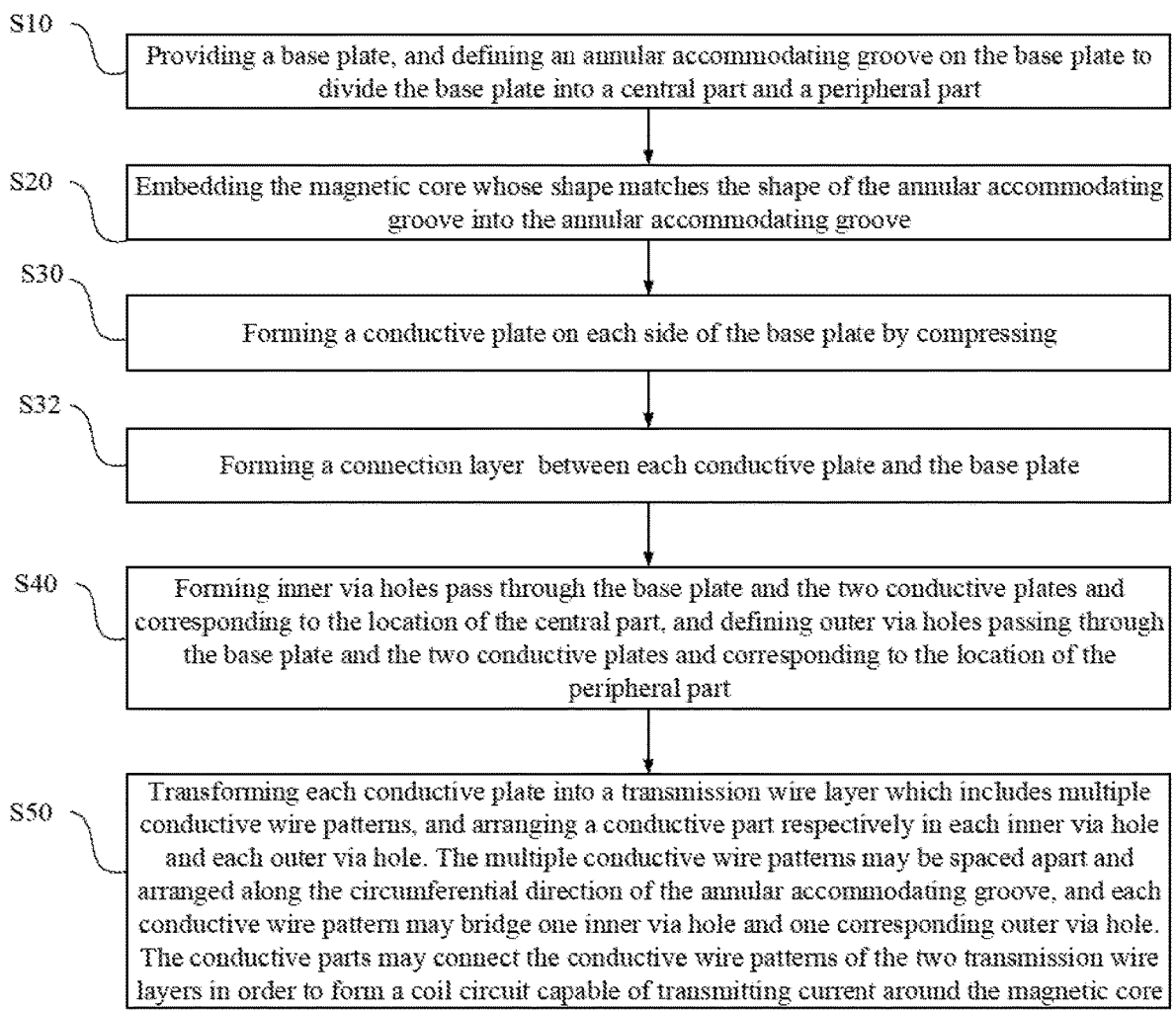
FIG. 10 is a schematic flow chart of a method of manufacturing a transformer according to one embodiment of the present disclosure.

Referring to FIG. 4 and FIG. 10, the present disclosure also provides a manufacturing method of the transformer 110. Referring also to FIG. 1, FIG. 2 and FIG. 3, the manufacturing method of the transformer 110 may include the following blocks.

S10: Providing a base plate 10, and defining an annular accommodating groove 18 on the base plate 10 to divide the base plate 10 into a central part 12 and a peripheral part 14.

In this embodiment, the baseplate 10 can be a plate that does not contain conductive metal layers. The annular accommodating groove 18 can be defined on any surface of the base plate 10. In another embodiment, a base block may be provided, and the base block may include the base plate 10, the connection layer and the transmission wire layer which are orderly stacked. The annular accommodating groove 18 which divides the base plate 10 into the central part 12 and the peripheral part 14 may be defined on one side of the base plate 10 on which the transmission wire layer has not been formed.

The base plate 10 can be made of resin material with fire resistance rating of FR4. The annular accommodating groove 18 may be formed on the base plate 10 by milling processing.

S20: Embedding the magnetic core 16 whose shape matches the shape of the annular accommodating groove 18 into the annular accommodating groove 18.

The magnetic core 16 can include manganese-zinc ferrite or nickel-zinc ferrite or other magnetic metal oxides. The magnetic core 16 can be engaged in the annular accommodating groove 18 by interference fit, which makes the magnetic core 16 to be fixed in the annular accommodating groove 18 of the base plate 10. In another embodiment, the size of the magnetic core 16 may be slightly smaller than the size of the annular accommodating groove 18. The height of the magnetic core 16 may be less than or equal to the height of the annular accommodating groove 18 in order to reduce the pressure applied on the magnetic core 16 when the whole structure is compressed together, and to reduce the breaking probability of the magnetic core 16.

At least a portion of the surface of the magnetic core 16 can be wrapped with elastic material. Then the magnetic core 16 may be disposed in the corresponding annular accommodating groove 18. It should be noticed that in some embodiments there may be multiple magnetic cores 16 and multiple annular accommodating grooves 18, and the multiple magnetic cores 16 may be respectively disposed in a corresponding annular accommodating groove 18. In this circumstance, at least one of the magnetic cores 16 may be wrapped with elastic material. Then an insulating layer may be arranged on the surface of the base plate 10 which is also the opening side of the annular accommodating groove 18 to form a cavity receiving the magnetic core 16. The cavity may be either closed or unenclosed.

Furthermore, a coating layer for fixing the magnetic core 16 in the annular accommodating groove 18 may be set on the outer surface of the magnetic core 16.

S30: Forming a conductive plate on each side of the base plate 10 by compressing.

The block S30 may include: successively stacking a first conductive plate, a first connecting plate, the baseplate, a second connecting plate and a second conductive plate together by thereto-compression.

In this embodiment, the method for forming a conductive plate on each side of the base plate 10 may include: disposing the connection layer 40 on each side of the base plate 10, then arranging a conductive plate on the side of each connection layer 40 away from the base plate 10, and integrating the base plate 10, the connection layers 40 and the conductive plates by thermo-compression such that each conductive plate may be fixed on one side of the base plate 10 by the corresponding connection layer 40. During the thereto-compression, the connection layer 40 can be melted so that each conductive plate may be adhered to one side of the base plate 10 by the melted connection layer 40. The connection layer 40 can also insulate the magnetic core 16 from the conductive plates on both sides, so as to prevent electrical connection between the magnetic core 16 and the conductive plates. The connection layer 40 can be made of insulating adhesive material, for example, material with a dielectric loss less than 0.02.

The block of forming a conductive plate on each side of the base plate 10 by compressing may further include:

S32: Forming a connection layer 40 between each conductive plate and the base plate 10.

In this block, each conductive plate and the corresponding connection layer 40 can constitute a conductive unit, that is, the method in this embodiment can also include arranging a conductive unit on each side of the base plate 10. In an embodiment, the connection layer may be a solid connecting plate. The connecting plate and the conductive plate may be stacked on the baseplate successively, and the conductive plate can be pasted onto the base plate 10 after the connecting plate forms the connection layer 40. Certainly, in other embodiments, the connection layer can alternatively be liquid, and is painted between the conductive plate and the baseplate 10.

The dielectric loss of at least one connection layer 40 may be less than or equal to 0.02 such that the transmission loss of the signal transmitting in each transmission wire layer may be reduced, and the signal transmission efficiency in the transmission wire layer may be improved. The material of the connection layer 40 may have high magnetic transmission speed and low magnetic loss, e.g., organic resin. For example, the material of the connection layer 40 can be the material of the model TU863F or TU872SLK made by Taiwan Union Technology Corporation, model M4 or M6 made by Panasonic Industrial Devices Materials, MW1000 made by Nelco Company or the model EM285 made by Elite Material Co., Ltd.

S40: Forming inner via holes 13 passing through the base plate 10 and the two conductive plate and corresponding to the location of the central part 12, and forming outer via holes 15 passing through the base plate 10 and the two conductive plates and corresponding to the location of the peripheral part 14.

After the two conductive plates on the two sides of the base plate 10 has been formed, it is required to form the inner via holes 13 on the central part 12 of the base plate 10, and form the outer via hole 15 on the peripheral part 14 of the base plate 10. The inner via holes 13 and the outer via holes 15 may run through the base plate 10 and the two conductive plates.

S50: Transforming each conductive plate into a transmission wire layer which includes multiple conductive wire patterns 22, and arranging a conductive part 17 respectively in each inner via hole 13 and each outer via hole 15. The multiple conductive wire patterns 22 may be spaced apart and arranged alone the circumferential direction of the annular accommodating groove 18, and each conductive wire pattern 22 may bridge one inner via hole 13 and one corresponding outer via hole 15. All the conductive parts 17 in the inner via holes 13 and the conductive parts 17 in the outer via holes 15 may connect the corresponding conductive wire patterns 22 of the two transmission wire layers 30 in order, so as to form a coil circuit capable of transmitting current around the magnetic core 16. The conductive part 17 may be manufactured based on any method described above.

After finishing the arrangement of the inner via holes 13 and the outer via holes 15, the conductive wire patterns 22 may be manufactured. That is, the two conductive plates may each be formed into a plurality of conductive wire patterns. The method of forming the conductive wire patterns 22 may be etching the two conductive plates to transform the two conductive plates into multiple conductive wire patterns 22 which may bridge one inner via hole 13 and one corresponding outer via hole 15. Thus, the two conductive plates may respectively form the first transmission wire layer 20 and the second transmission wire layer 30 both including multiple conductive wire patterns 22. In some embodiment, a connection layer 40 may be disposed between each conductive plate and the base plate 10. In this circumstance, after the transmission wire layers have been formed by etching, each transmission wire layer and the corresponding connection layer 40, i.e., the conductive plate and the adjacent connection layer 40 which is located at the side of the conductive plate close to the base plate 10, may constitute a transmission unit. Specifically, the transmission unit may be set on each side of the base plate along the axial direction of the inner via holes 13 of the base plate 10. The dielectric loss of the connection layer 40 between at least one transmission wire layer of the two transmission units and the base plate 10 may be less than or equal to 0.02.

Optionally, on one side of the base plate 10 along the axial direction of the inner via holes 13 may be arranged one transmission unit, and on the opposite side of the base plate may be arranged two adjacent transmission units. The dielectric loss of the connection layer 40 between the two adjacent transmission units may be less than or equal to 0.02.

The dielectric loss of the connection layer 40 in each transmission unit may be less than or equal to 0.02, such that the signal transmission loss in each transmission wire layer of each transmission unit may be reduced, and the signal transmission efficiency of the transmission wire layer may be improved.

The specific method of transforming the conductive plate into the conductive wire patterns 22 can be as follows. Firstly, a masking layer covering a portion of the conductive plate corresponding to the conductive wire patterns 22 to be formed may be set by exposing and developing. Then, the conductive plate may be etched such that a portion of the conductive plate which is not covered by the masking layer may be dissolved. After the etching is completed, the base plate 10 may be washed and the etching solution on the surface may be removed. After the masking layer is removed, the conductive wire patterns 22 may be acquired, that is, the first transmission wire layer 20 and the second transmission wire layer 30 each including multiple conductive wire patterns 22 may be formed.

The conductive wire patterns 22 can also include input lines and coupling lines. The input lines and the coupling lines may be arranged either in same layer or in different layers as described above. Therefore, in the embodiment, the coupling effect of the transformer 110 can be improved by reasonably arranging the input lines 222 and the coupling lines 224. When the input lines 222 and the coupling lines 224 are arranged in different layers, the space for arranging the input lines 222 and the coupling lines 224 may be increased, which allows the width of both the input lines 222 and the coupling lines 224 to be increased. Thus, the over current capacity of the whole transformer 110 may be improved.

Figure 11:
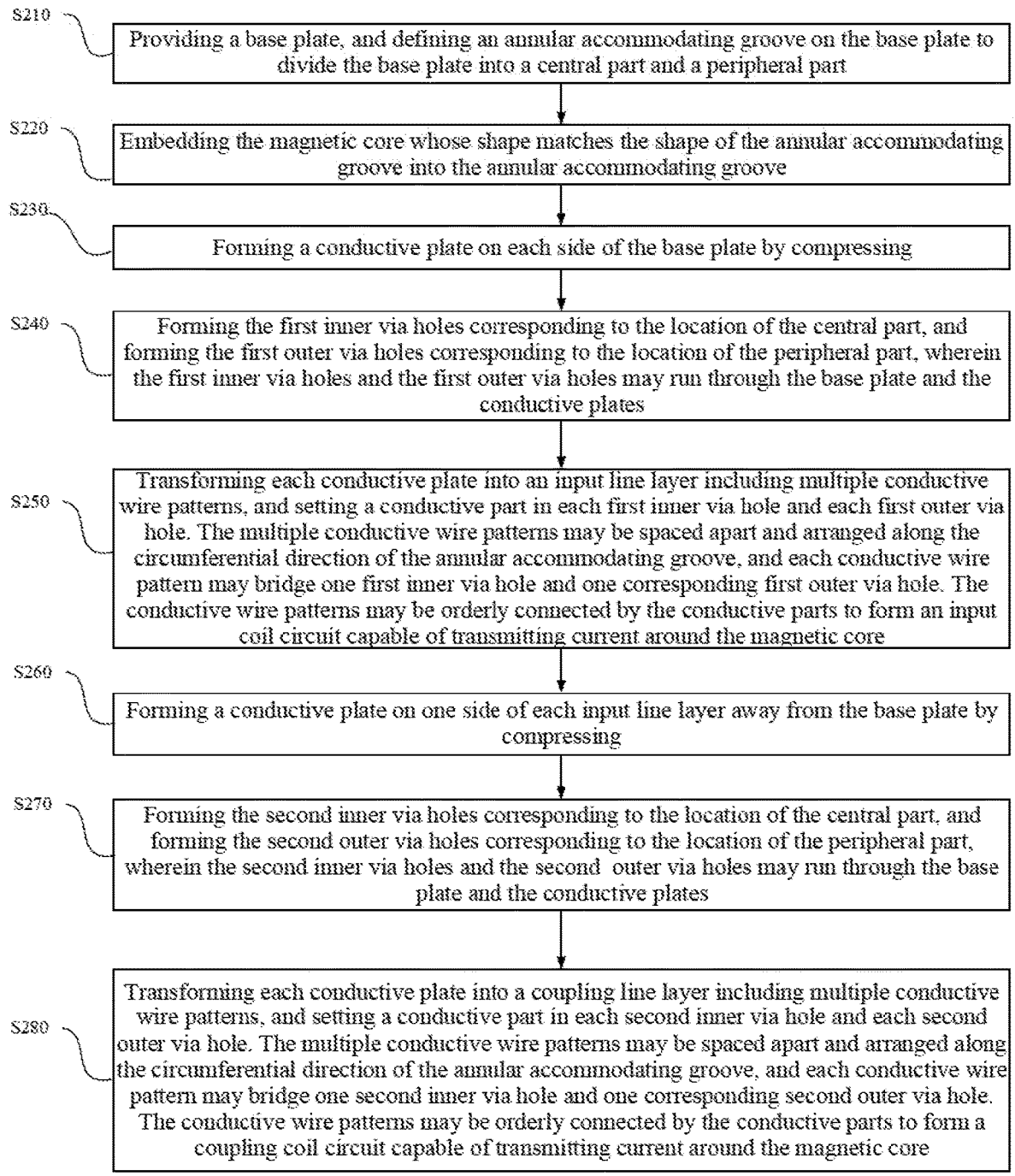
FIG. 11 is a schematic flow chart of a method of manufacturing a transformer according to another embodiment of the present disclosure.

In the above described embodiment, one conductive plate may be arranged on each side of the base plate 10 to form one transmission wire layer. In other embodiments, on each side of the base plate 10 there may be arranged one input line layer and one coupling line layer. Specifically, referring to FIG. 11, in this embodiment, the block S210, S220 and S230 may be same as the method used for arranging only one transmission wire layer. Detailed information may be found in above-described embodiment and will not be described hereon. In this embodiment, the method may further include the following blocks.

S240: Forming the first inner via holes 132 corresponding to the location of the central part 12, and forming the first outer via holes 134 corresponding to the location of the peripheral part 14. The first inner via holes 132 and the first outer via holes 152 may run through the base plate 10 and the conductive plates.

After the two conductive plates are set on both sides of the base plate 10, the first inner via holes 132 may be formed corresponding to the location of the central part 12 of the base plate 10, and the first outer via holes 152 may be formed corresponding to the location of the peripheral part 14. The first inner via hole 132 and the first outer via hole 152 may both run through the base plate 10 and the two conductive plates.

S250: Transforming each conductive plate into an input line layer including multiple conductive wire patterns, and setting a conductive part 17 in each first inner via hole 132 and each first outer via hole 152. The multiple conductive wire patterns 22 may be spaced apart and arranged along the circumferential direction of the annular accommodating groove 18, and each conductive wire pattern 22 may bridge one first inner via hole 132 and one corresponding first outer via hole 152. The conductive wire patterns 22 may be orderly connected by the conductive parts 17 to form an input coil circuit capable of transmitting current around the magnetic core 16.

After the first inner via holes 132 and the first outer via holes 152 are formed, the conductive wire patterns 22 may be made. That is, the two conductive plates may be formed into the conductive wire patterns 22 to form the input coil circuit. The way of arranging the conductive wire patterns 22 is the same as that of the above-described embodiment and will not be described hereon.

S260: Forming a conductive plate on one side of each input line layer away from the base plate 10 by compressing.

In this block, a conductive plate may be further provided on the input line layers located on two sides of the base plate 10 by compressing. Detailed information for compressing may be found in above-described embodiments.

S270: Forming the second inner via holes 134 corresponding to the location of the central part 12, and forming the second outer via holes 154 corresponding to the location of the peripheral part 14. The second inner via holes 134 and the second outer via holes 154 may both run through the base plate 10 and the conductive plate.

S280: Transforming each conductive plate into a coupling line layer including multiple conductive wire patterns 22, and setting a conductive part 17 in each second inner via hole 134 and each second outer via hole 154. The multiple conductive wire patterns 22 may be spaced apart and arranged along the circumferential direction of the annular accommodating groove 18, and each conductive wire pattern 22 may bridge one second inner via hole 134 and one corresponding second outer via hole 154. The conductive wire patterns 22 may be orderly connected by the conductive parts 17 to form a coupling coil circuit capable of transmitting current around the magnetic core 16.

Figure 12:
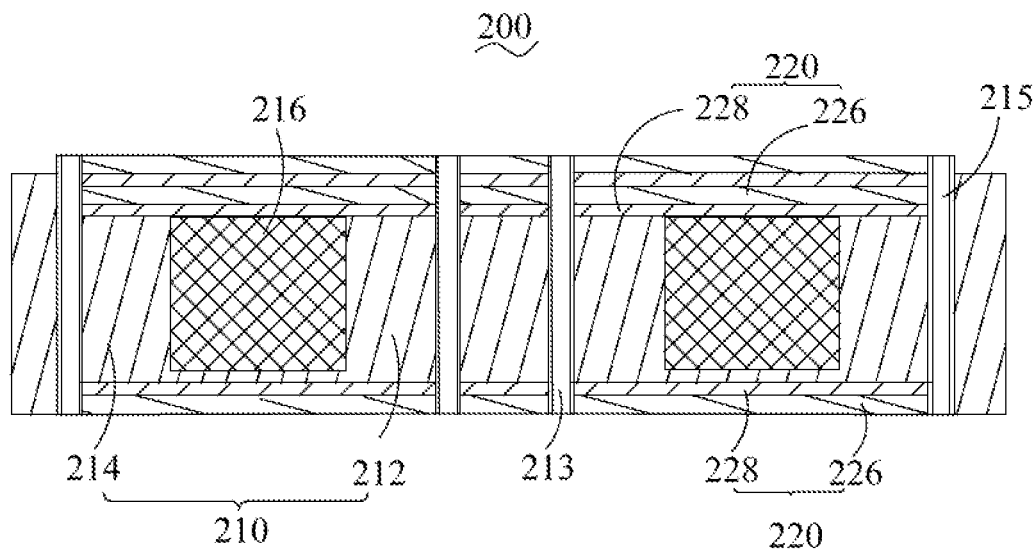
FIG. 12 is schematic structural view of an electromagnetic device according to another embodiment of the present disclosure.

The present disclosure further provides an electromagnetic device 200. The electromagnetic device 200 can be an inductor, a filter, or the above described transformer. As shown in FIG. 12, the electromagnetic device 200 of any type may generally include a baseplate 210, a magnetic core 216 and at least one transmission unit 220 which is arranged on each side of the baseplate 210. The transmission unit 220 can include a transmission wire layer 226 composed of multiple conductive wires arranged around the magnetic core 216 which form a coil and a connection layer 228 connected between the transmission wire layer 226 and the baseplate 210. The connection layer 228 can be made of material with a dielectric loss less than or equal to 0.02. In this embodiment, at one side of the baseplate 210 may be arranged two transmission units 220, and on the opposite side of the baseplate 210 may be arranged only one transmission unit 220.

When the multiple conductive wire patterns include input lines and coupling lines, the magnetic device 200 can be a transformer. When the multiple conductive wire patterns form a set of coil arranged surrounding the magnetic core 216, the electromagnetic device 200 can be an inductor. When the multiple conductive wire patterns form two sets of coil arranged surrounding the magnetic core 216, the electromagnetic device 200 can be a wave filter. The detailed structure of the electromagnetic device 200 as a transformer has been described above and will not be repeated hereon.

Figure 13:
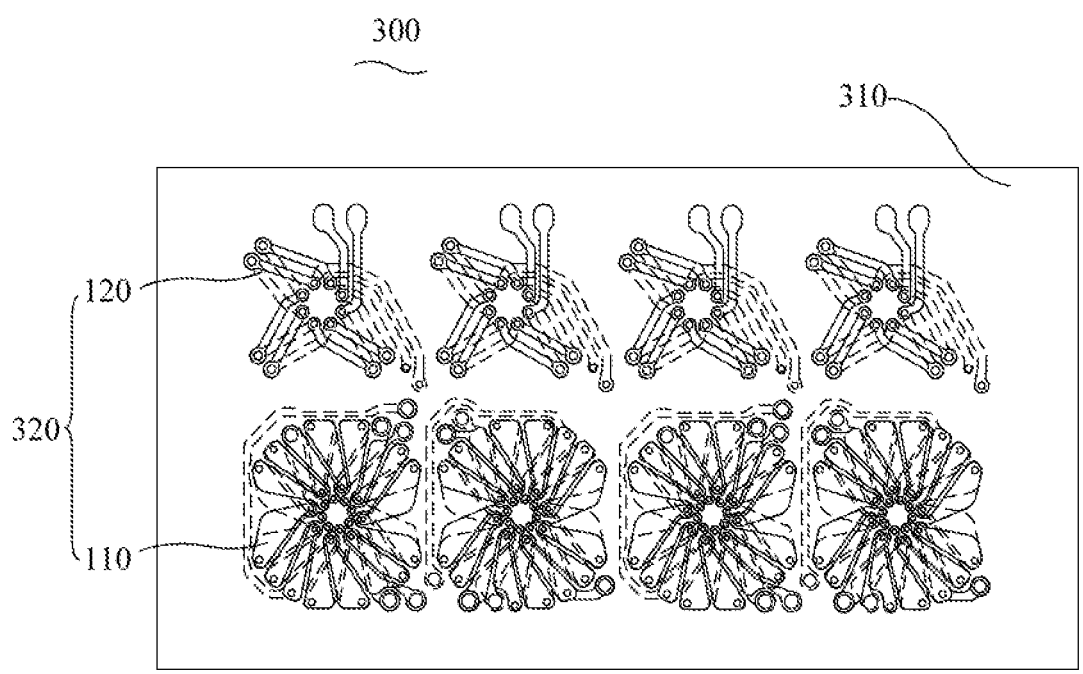
FIG. 13 is a plan view of an integrated transformer including wave filters and transformers installed in the same layer according to an embodiment of the present disclosure.
Figure 14:
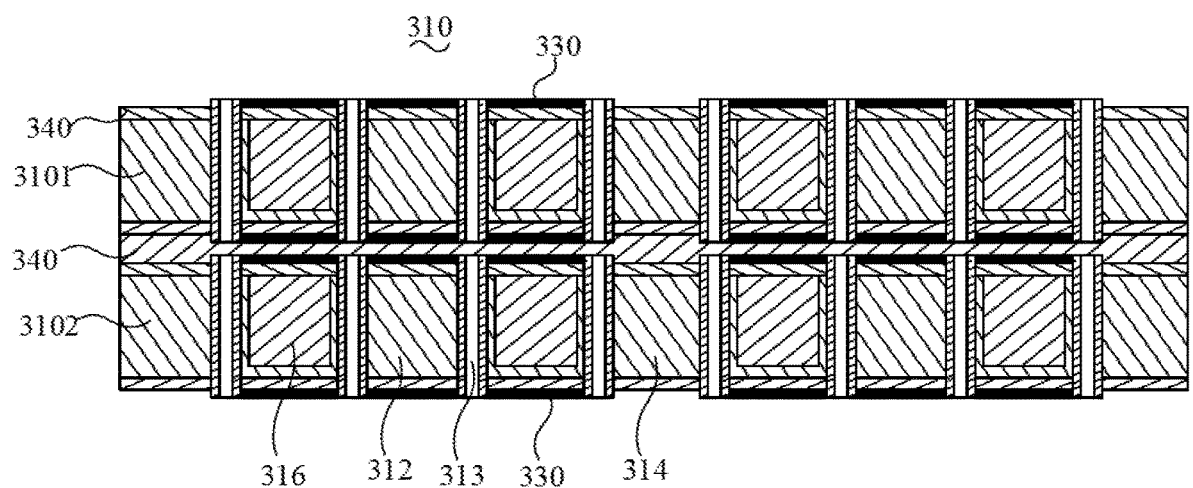
FIG. 14 is a schematic structural view of an integrated transformer containing multi-layer base plates according to an embodiment of the present disclosure.

Furthermore, still referring to FIG. 13 and FIG. 14, based on the above described transformer 110, the present disclosure further provides an integrated transformer 300. The integrated transformer 300 may include at least one layer of baseplate 310. The baseplate 310 may be similar as the base plate 10 described in the above embodiments (as shown in FIG. 1, FIG. 2 or FIG. 3). The base plate 310 may have a larger size, which can be used to form multiple transformers 110 and wave filters 120.

Still referring to FIG. 13 and FIG. 14, each layer of baseplate 310 may define multiple annular accommodating grooves each corresponding to one transformer 110 or one ware filter 120. The base plate 310 may be divided into multiple central parts 312 and a peripheral part 314. Each central part 312 is surrounded by one corresponding annular accommodating groove. The structure of each transformer 110 and each wave filter 120 may be the same as that of the above described transformer 110, that is, including a central part, a peripheral part, a magnetic core embedded in the annular accommodating groove and the transmission wire layers located at the two opposite sides of the base plate 310. The structures of these components may be similar as those described above and will not be repeated hereon. Therefore, the multiple central parts and the corresponding peripheral part of the base plate, the multiple magnetic cores, and the transmission wire layers located at the two opposite sides of the baseplate may constitute the multiple transformers 110 and wave filters 120 based on predetermined arrangement. At least one transformer 110 and at least one wave filter 120 may be electrically connected to form an electromagnetic assembly 320.

In an embodiment, referring to FIG. 13, the integrated transformer 300 can only include one layer of base plate 310. Four sets of the electromagnetic assembly 320 may be arranged on the base plate 310. All the transformers 110 and the wave filters 120 in each electromagnetic assembly 320 may be electrically connected, and the electromagnetic assemblies 320 are not electrically connected to each other.

Further referring to FIG. 13, in the embodiment, each electromagnetic assembly 320 may include one transformer 110 and one wave filter 120. In this case, the transformer 110 and the wave filter 120 in a same electromagnetic assembly 320 may be electrically connected, and the transformer 110 and the wave filter 120 in different electromagnetic assemblies may not be electrically connected.

In another embodiment, each electromagnetic assembly 320 can include two transformers 110 and one wave filter 12. The wave filter 120 may be connected between the two transformers 110. In this case, the two transformers 110 and the wave filter 120 in a same electromagnetic assembly may be electrically connected. The transformers 110 and the wave filter 120 in different electromagnetic assemblies may not be electrically connected to each other.

In another embodiment, the integrated transformer 300 can include multiple layers of base plates 310. For example, in the embodiment shown in FIG. 13, the integrated transformer 300 can include three layers of base plates 310, and the multiple layers of base plates 310 may be stacked together alone the axial direction of the inner via holes 313. On each base plate 310 there may be formed multiple transformers 110 and wave filters 120. At least one transformer 110 and at least one wave filter 120 may be electrically connected to form an electromagnetic assembly 320. All the transformers 110 and all the wave filters 120 in a same electromagnetic component 320 formed on a same base plate 310 may be electrically connected, and the transformers 110 and the wave filters 120 in different electromagnetic assemblies 320 may not be connected to each other.

In the embodiment, the arrangement the electromagnetic assemblies 320 may be similar to that described in the above embodiment, and will not be repeated hereon.

In above described embodiments, the transformers 110 and the wave filters 120 may be arranged in a same layer. Alternatively, in other embodiments, the transformers 110 and the wave filters 120 also can be arranged in different layers. In an embodiment, the integrated transformer 300 can include at least two layers of base plates 310 stacked together. The at least two layers of base plates 310 may include at least one layer of first base plate 3101 and at least one layer of second base plate 3102. The first base plate 3101 and the second base plate 3102 may be similar to the base plate 10 described in the above embodiments (as shown in FIG. 1, FIG. 2 and FIG. 3). The difference is that the size of the first base plate 3101 and the second base plate 3102 may be larger. Thus, the first base plate 3101 and the second base plate 3102 can each define multiple annular accommodating grooves used for accommodating magnetic cores corresponding to multiple transformers 110 or multiple wave filters. On the first base plate 3101 there may be formed only the transformers 110 while on the second base plate 3102 there may be formed only the wave fillers 120.

Specifically, the first base plate 3101 may define multiple annular accommodating grooves which are in one-to-one correspondence with the transformers 110. The first base plate 3101 may be divided into multiple central parts 312 surrounded by one corresponding annular accommodating groove and a peripheral part 314 surrounding the annular accommodating grooves. The structure of each transformer 110 may be the same as that of the above-described transformer 110, i.e., including the central part, the peripheral part, the magnetic core embedded in the annular accommodating groove and the transmission wire layers located at the two opposite sides of the first base plate 3101. The structures of these devices may be similar to those described above and will not be repeated hereon. Through this way, on each layer of first base plate 3101 there can be formed multiple transformers 110.

Similarly, the second base plate 3102 may define multiple annular accommodating grooves which are in one-to-me correspondence with the wave filters 120. The second base plate 3102 may be divided into multiple central parts 312 each surrounded by one corresponding annular accommodating groove and a peripheral part 314 surrounding the annular accommodating grooves. The structure of each wave filter 120 may be similar to that of the above described transformer 110, i.e., including the central part, the peripheral part, the magnetic core embedded in the annular accommodating groove and the transmission wire layers located at the two opposite sides of the second base plate 3102. The structures of these components may be similar to those described above and will not be repeated hereon. Through this way, on each layer of second base plate 3102 there can be formed multiple wave filters 120.

When there are multiple layers of base plates 310, in an embodiment, the multiple first base plates 3101 arranged with transformers 110 and the multiple second base plates 3102 arranged with wave filters 120 can be alternately arranged. That is, the transformers 110 and the wave filters 120 in the integrated transformer 300 may be located at different layers, and at least one transformer 110 and at least one wave filter 120 located respectively on two adjacent base plates 3101 and 3102 may constitute an electromagnetic assembly. For example, at least one transformer 110 on the first base plate 3101 and at least one wave filter 120 on the second base plate 3102 can constitute an electromagnetic assembly. All the transformers 110 and the wave filters 120 in a same electromagnetic assembly may be electrically connected, and different electromagnetic assemblies are not electrically connected.

In another embodiment, multiple first base plates 3101 arranged with transformers 110 can be firstly stacked together, and then multiple second base plates 3102 arranged with wave filters 120 may be stacked on the first base plates 3101.

On the first base plate 3101 there may be formed multiple transformers 110. In other word, the multiple transformers 110 may share one first base plate 3101. In this situation, the first base plate 3101 together with the multiple transformers can also be called a transformer layer. On the second base plate 3102 there may be formed multiple wave filters 120. In other word, the multiple wave filters 120 may share one second base plate 3102. In this situation, the second base plate 3102 together with the multiple wave filters may also be called a wave filter layer.

The electrical connection between one transformer of the transformer layer and one corresponding wave filter of the wave filter layer may be realized by a conductive via hole and a conductive part in the conductive via hole. The conductive via hole and the conductive part may both pass through the transformer layer and the filter layer.

Furthermore, the electrical connection between one transformer and one corresponding wave filter also can be realized by a conductive blind hole and a conductive part in the blind hole. The conductive blind hole may extend from the transmission wire layer on one side of the transformer layer away from the wave filter layer to the transmission wire layer on one side of the wave filter layer close to the transformer layer. Alternatively, the conductive blind hole can also extend from the transmission wire layer on one side of the wave filter layer away from the transformer layer to the transmission wire layer on one side of the transformer layer close to the wave filter layer. Furthermore, the electrical connection between the transformer and the wave filter may be achieved under the cooperation of the conductive via hole (or conductive blind hole) and the conductive wire patterns of the transmission wire layer connected with the conductive via hole (or conductive blind hole).

Figure 15:
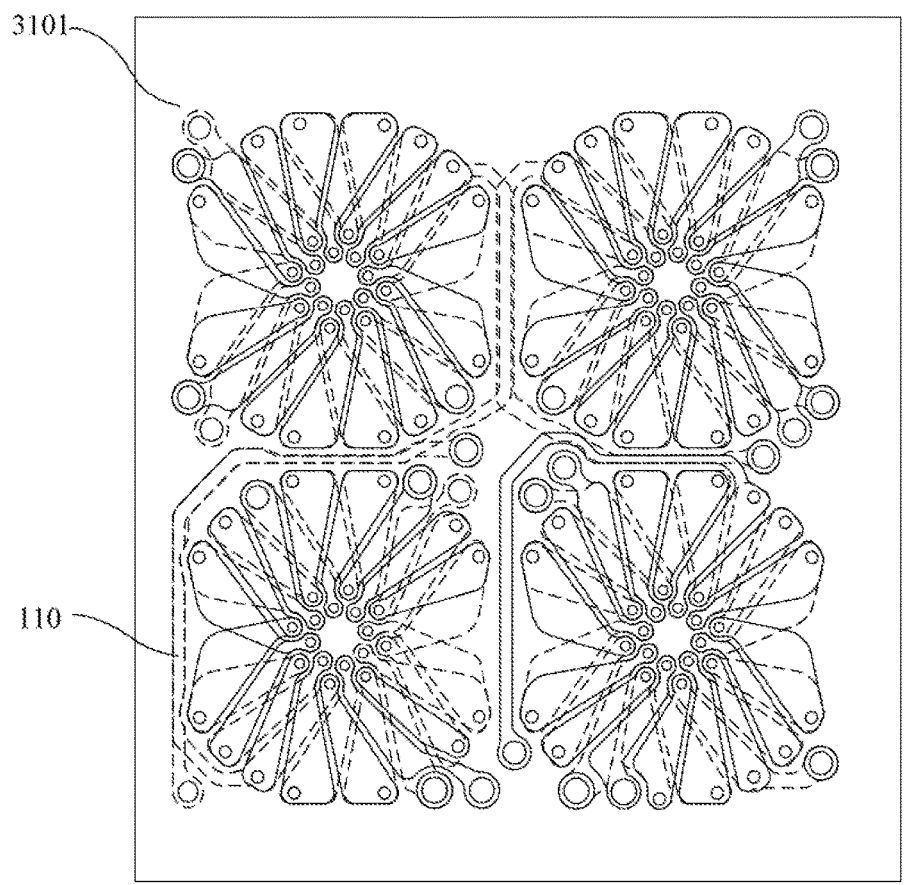
FIG. 15 is a plan view of a transformer layer of an integrated transformer including wave filters and transformers disposed in different layers according to another embodiment of the present disclosure.
Figure 16:
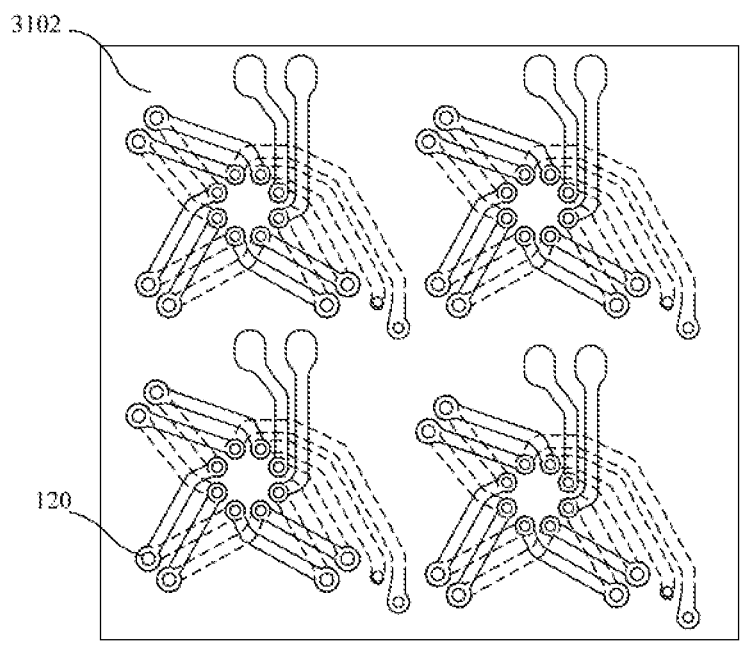
FIG. 16 is a plan view of a wave filter layer of an integrated transformer including a wave filter and a transformer disposed in different layers according to another embodiment of the present disclosure.

Referring to FIGS. 14-16, in one embodiment, the integrated transformer 300 may include two layers of base plates 310 including the first base plate 3101 and the second base plate 3102. On the first base plate 3101 there may be formed four transformers 110 (referring to FIG. 15), and on the second base plate 3102 there may be formed four wave filters 120 (referring to FIG. 16). In this embodiment, the structure of each transformer 110 and each wave filter 120 may be similar to those described above and will not be repeated hereon.

Furthermore, the integrated transformer 300 also can include multiple layers of base plates 310. For example, there may be at least three layers of base plates 310, and the multiple base plates 310 may be stacked together. The arrangement of the integrated transformer 300 with multiple layers of base plates may be similar to the multi-base-plate structure described above. The difference is that on each base plate 310, there may be formed either only transformers 110 or only wave filters 120.

For network transformers, the transformer should have a larger inductance value, and thus, the volume of the magnetic core of the transformer is usually larger than that of the magnetic core of the transformer. That is, the height of the magnetic core of the transformer is generally larger than the height of the magnetic core of the wave filter. For example, in a multi-layer structure, each layer may include one or more transformers, which will increase the total height of the integrated transformer. In this embodiment, the transformers 110 and the wave filters 120 may be arranged in different layers. Thus, the base plate shared by the wave filters may have a smaller thickness than the base plate shared by the transformers. Therefore, compared with the structure where the transformers and wave filters share a common base plate, the implementation of this embodiment may make the structure of the integrated transformer 300 more compact. In addition, the thickness of the transmission wire layer of the wave filter 120 can be smaller than that of the transmission wire layer of the transformer 110. Thus, when the base plates are stacked together, the structure in which the wave filter 120 and the transformer 110 are arranged in different layers may have a smaller thickness than the structure where the wave filter 120 and the transformer 110 are arranged in a same layer. Accordingly, the compactness of the structure of the integrated transformer may be further improved.

In the embodiment, still referring to FIG. 13, connection layers 340 may be respectively disposed between the first base plate 3101 and the transmission wire layer located on each side of the first base plate 3101, and between the second base plate 3102 and the transmission wire layer located on each side of the second base plate 3102. The dielectric loss of at least one of the above connection layers 340 may be less than or equal to 0.02.

By controlling the dielectric loss of the connection layer 340 less than or equal to 0.02, it can make the loss of the signal to be reduced when the transmission wire layer 330 is transmitting signal, and therefore the signal transmission efficiency can be improved.

Figure 17:
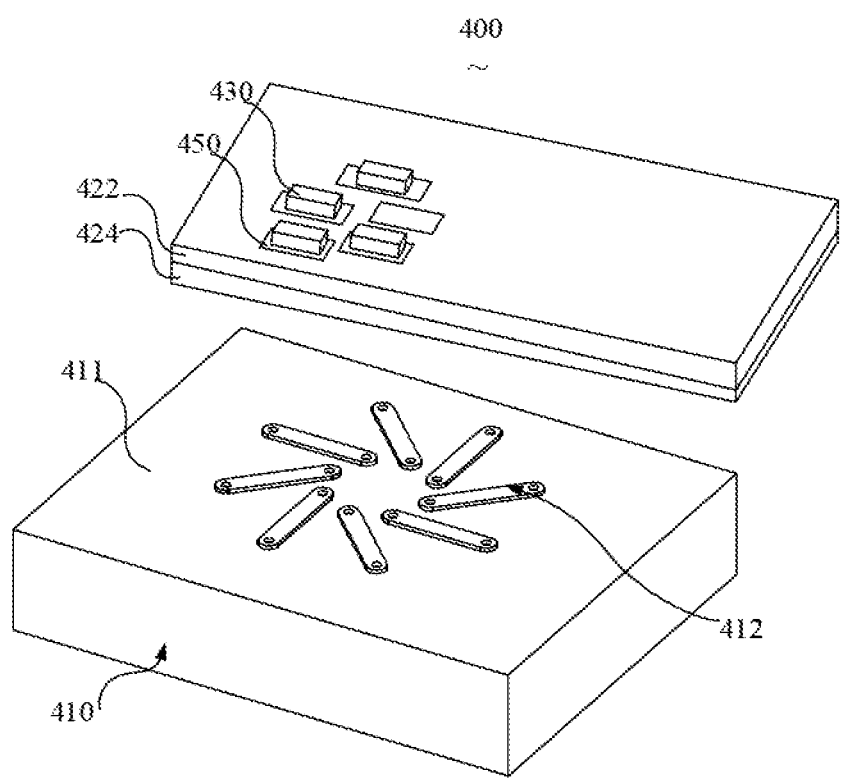
FIG. 17 is a schematic structural view of an exemplary electromagnetic device according to one embodiment of the present disclosure.

Furthermore, the present disclosure further provides an electromagnetic device 400. As shown in FIG. 17, the electromagnetic device 400 may include an electromagnetic element 410 (such as inductor, transformer and wave filter among which the transformer will be taken as example in the following description) and a composite layer 420 arranged on of the electromagnetic element. The structure of the electromagnetic element 410 may be similar to the transformer or the wave filter described in previous embodiments and will not be repeated hereon.

Figure 18:
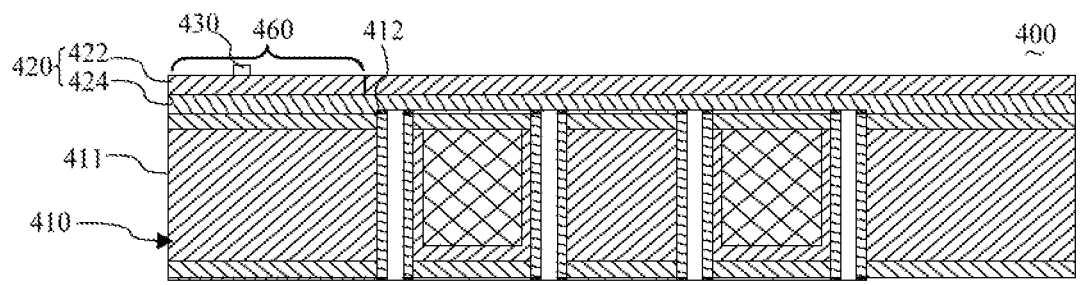
FIG. 18 is a schematic section view of the electromagnetic device of FIG. 17.

Referring to FIG. 17 and FIG. 18, the composite layer 420 may be disposed on a side of the transmission wire layer 412 of the electromagnetic element 410 farthest from the base plate 411. The composite layer 420 may be used to arrange an electronic component 430 such that the electronic component 430 may be electrically connected with at least one transmission wire layer 412 adjacent to the composite layer 420.

Further referring to FIG. 17 and FIG. 18, the composite layer 420 may include an adhesive layer 424 and a conductive layer 422. The adhesive layer 424 may be located between the conductive layer 422 and the corresponding transmission wire layer 412. The adhesive layer 424 may be used to fix the conductive layer 422 on the transmission wire layer 412 of the electromagnetic element 410, and to separate the conductive layer 422 from the transmission wire layer 412 to prevent short circuits. The electronic component 430 may be attached on the conductive layer 422.

Specifically, in an embodiment, the electronic component 430 may include lead-out terminals (not shown). The conductive layer 422 may include an element connecting part 450 which is used to fix the lead-out terminals of the electronic component 430. Furthermore, the conductive layer 422 may further include a conductive connecting line (not shown), and the conductive layer 422 may define multiple first conductive holes (not shown) therein. The conductive connecting line may electrically connect the first conductive hole and the element connecting part 450. Each first conductive hole may extend from the conductive layer 422 to at least one transmission wire layer.

In the embodiment, the element connecting part 450 can be a weld plate or a connecting finger, and the lead-out terminals of the electronic component 430 may be fixed on one side of the element connecting part 450 away from the adhesive layer 424.

In another embodiment, the element connecting part 450 also can be the second conductive hole, and the second conductive hole may extend from the conductive layer 422 to at least one transmission wire layer. The lead-out terminals of each electronic component 430 may be inserted into the corresponding second conductive hole and electrically connected with the inner wall of the corresponding second conductive hole. In an embodiment, a conductive connector may be utilized to fixedly connect each lead-out terminal and the inner wall of the second conductive hole. In another embodiment, each lead-out terminal and the inner wall of the corresponding second conductive hole can be mutually abutted.

Furthermore, in other embodiments, the electromagnetic device 400 also can include an electromagnetic element 410, a composite layer 420 arranged on the electromagnetic element 410 and an electronic component 430 arranged on the composite layer 420 and electrically connected with the electromagnetic element 410. The detailed structure of the electromagnetic element 410, the composite layer 420 and the electronic component 430 may be similar to those described in above embodiments and will not be repeated hereon. The number of the electronic component 430 can be one or more, and the electronic component 430 can be a capacitor, a resistor and the like.

The electronic component 430 can form a wave filter circuit together with the composite layer 420. Specifically, the electromagnetic device 400 may also include a grounding terminal and a connecting conductor. The electronic component 430 can include a capacitor and a resistor. One end of the capacitor may connect to one end of the resistor through the connecting conductor. The other end of the capacitor may connect to the grounding terminal, and the other end of the resistor may be electrically connected to the coupling wire layer of the electromagnetic element 410.

Furthermore, the electromagnetic device 400 can further include multiple electronic components 430 arranged on the composite layer 420. The electronic component 430 can include but not limit to capacitor, resistor and inductor. In addition, the multiple electronic components 430 can be connected with each other to form a circuit with certain functions, such as a wave filter circuit. When multiple electronic components 430 are connected and form a wave filter circuit, they can filter out the interference signal in the signal processed by the transformer, and thereby improving the performance of the integrated electromagnetic device 400.

In this embodiment, in order to protect the conductive wire patterns of the transmission wire layer 412, and to prevent the conductive wire patterns of the transmission wire layer 412 from short circuit with other components, an insulating layer (not shown) may be set on one side of the transmission wire layer 412 away from to the base plate 411. In this embodiment, the insulating layer may be arranged on the surface of the composite layer. The insulating layer can be a coating layer of polyimide or ink.

Figure 19:
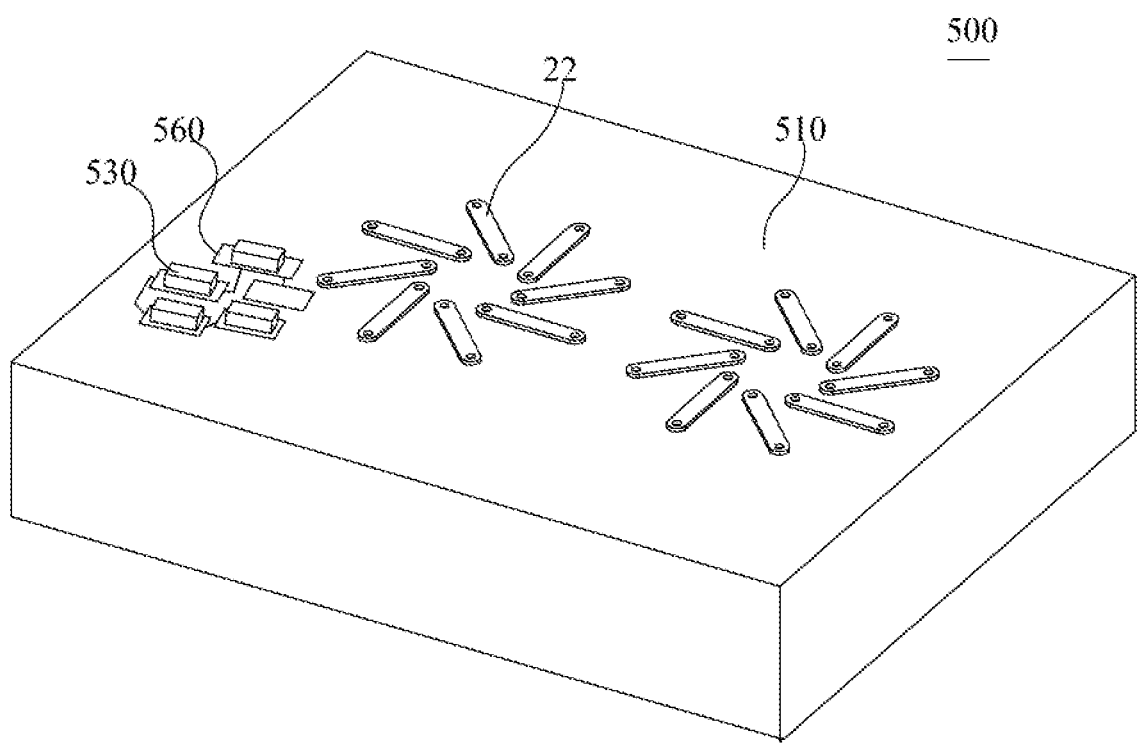
FIG. 19 is a schematic structural view of an exemplary electromagnetic device according to another embodiment of the present disclosure.
Figure 20:
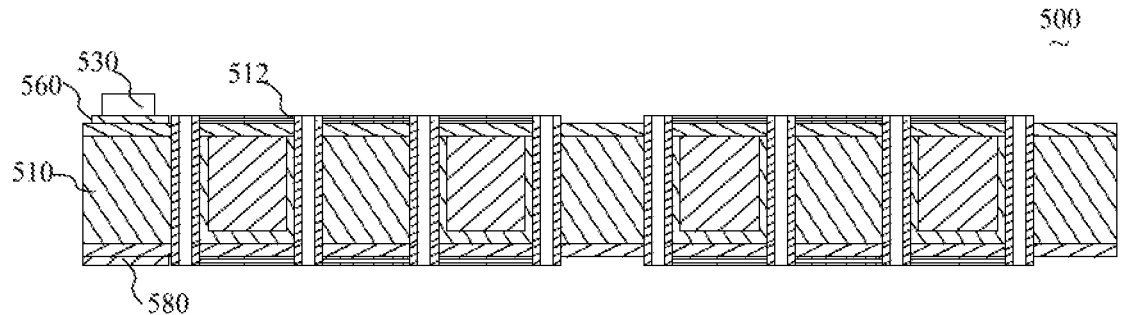
FIG. 20 is a schematic section view of the electromagnetic device of FIG. 19.

In this embodiment, the composite layer 420 may be set on a side of the transmission wire layer 412 away from the base plate 411, and the electronic component 430 may be disposed on the composite layer 420. In other embodiments, a bonding layer instead of the composite layer may be directly set on one side of the base plate where the transmission wire layer is disposed, and the electronic component 430 may be directly connected to the bonding layer. The term "directly" means that the electronic component 430 is connected to the bonding layer without any other intermediate medium. Actually, the electronic component 430 may include lead-out terminals, and the lead-out terminals may directly connect to the bonding layer. For example, in the embodiment shown in FIG. 19 and FIG. 20, a transmission wire layer 512 and a bonding layer 560 which are arranged in the same layer may be set on one side of a base plate 510 of an electromagnetic device 500. An electronic element 530 may directly connect to the bonding layer 560. The bonding layer 560 and the transmission wire layer 512 may be arranged on the same layer and electrically connected, but the bonding layer 560 and the transmission wire layer 512 are not overlapped. Specifically, the bonding layer 560 can be electrically connected with the transmission wire layer 512 arranged in the same layer by, for example, a conductive connection line. The term "no overlapping" does not exclude the use of conductive wires to connect the bonding layer 560 and the transmission wire layer 512.

In other embodiments, the bonding layer 560 also can be electrically connected with the transmission wire layer 512 on the other side of the base plate 510. For example, conductive via holes may be formed on the bonding layer 560, and electrical connection between the bonding layer 560 and the transmission wire layer located at the opposite side of the base plate 510 may be realized by the conductive via holes.

In this embodiment, a fixing layer 580 may be arranged on the transmission wire layer 512 located at the opposite side of the base plate 510 compared with the bonding layer 560. The fixing layer 580 may be used to fix and electrically connect the electromagnetic device 500 to an outer circuit (not shown). In this embodiment, the fixing layer 580 can also be arranged on the same layer with, but not overlap the transmission wire layer 512 on the same side, that is, the fixing layer 580 and the transmission wire layer 512 may be arranged on the same layer at one side of the base plate 510, and the fixing layer 580 may also be electrically connected with the transmission wire layer 512 at the same side. The fixing layer 580 can be a weld plate used to fix the whole electromagnetic device 500 to a preset position. For example it can fix the whole electromagnetic device 500 on a circuit plate, such that the electromagnetic device 500 may be connected to the preset circuit on the circuit plate.

Figure 21:
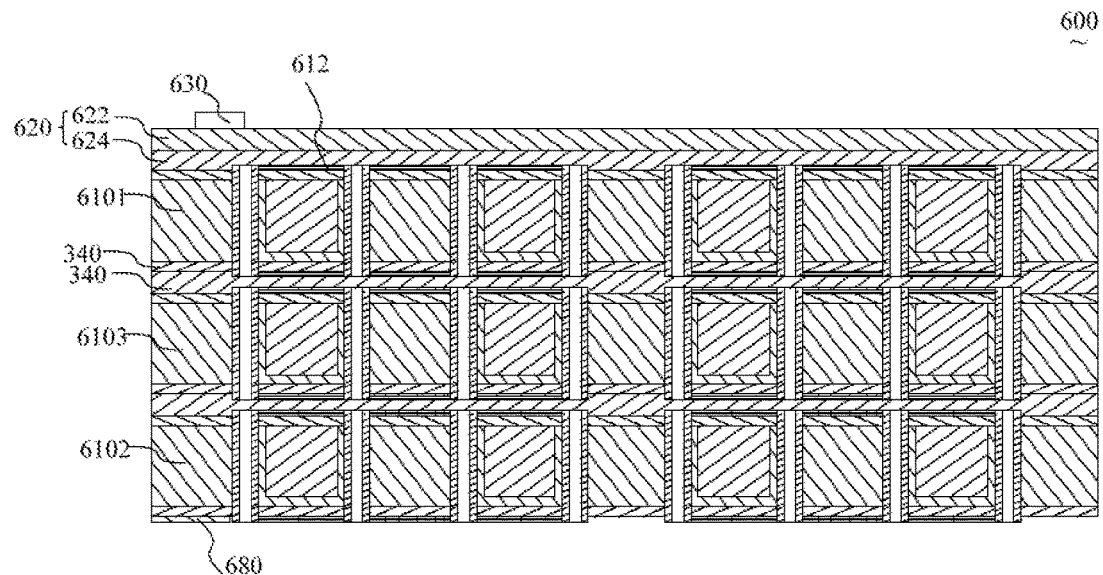
FIG. 21 is a schematic cross-sectional view of an exemplary integrated transformer according to one embodiment of the present disclosure.
Figure 22:
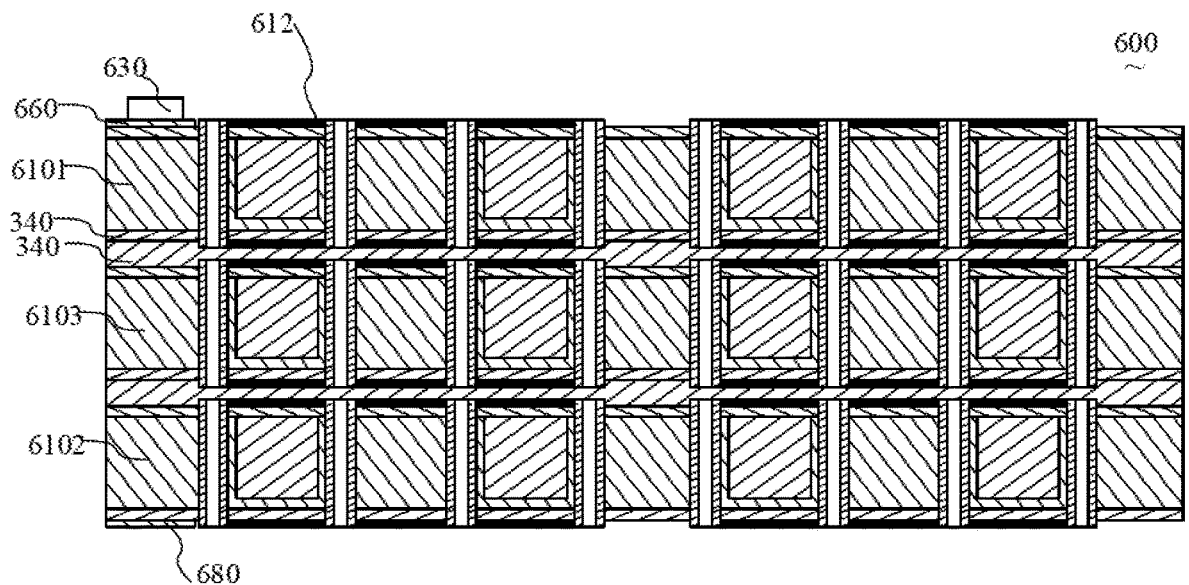
FIG. 22 is a schematic cross-sectional view of an exemplary integrated transformer according to another embodiment of the present disclosure.

Furthermore, the present disclosure also provides an integrated transformer. The integrated transformer can includes any integrated transformer as above described. Referring to FIGS. 21-22, the difference between the integrated transformer 600 of this embodiment from the above described integrated transformer is that, the integrated transformer 600 may include the composite layer (referring to FIG. 21) as that used in the above described electromagnetic device 400 on which the electronic component may be disposed or the bonding layer (referring to FIG. 22) as that used in the electromagnetic device 500 on which the electronic component may be disposed. The arrangements of the composite layer or the boding layer can be the same as above described. Similarly, the integrated transformer 600 can further include a fixing layer 680 configured to fix and electrically connect the integrated transformer to an external circuit.

In an embodiment, specifically, when the integrated transformer has only one layer of baseplate, on the base plate can be arranged at least one transformer and at least one wave filter electrically connected with at least one transformer. The specific arrangement of the transformer and the wave filter can refer to FIG. 13. Two transmission wire layers may be respectively set on two opposite sides of the base plate. A bonding layer may be disposed in a same layer as one of the transmission wire layers, or a composite layer may be arranged on a side of this transmission wire layer away from the base plate. Optionally, a fixing layer may be set on the side of the base plate opposite to the bonding layer or the composite layer. The fixing layer may be configured to fix and electrically connect the integrated transformer to an external circuit. In addition, because the number of conductive wire patterns of the wave filter may be less than that of the transformer, both the bonding layer and the fixing layer can be arranged on one side of the base plate close to the wave filter, which may make the structure of the integrated transformer more compact.

In another embodiment, the integrated transformer 600 can include multiple layers of base plates 610 orderly stacked together. The electronic component 630 can connect to the integrated transformer 600 by a composite layer 620 at one side of the transmission wire layer away from the base plate, or by a bonding layer 660 arranged on the base plate. Specifically, the bonding layer or the composite layer can be arranged on an outermost base plate, and the fixing layer can be arranged on another base plate which is farthest away from the base plate with the bonding layer or the composite layer, and on a side opposite to the bonding layer.

Referring to FIG. 21 and FIG. 22, in the embodiment, specifically, the integrated transformer 600 can include three layers of base plates 610 (the first baseplate 6101, the second baseplate 6102 and the third base plate 6103). The first baseplate 6101, the third baseplate 6103 and the second base plate 6102 may be electrically connected and stacked together along the axis of the inner via holes on one of the base plates. That is, the third base plate 6103 may be located between the first base plate 6101 and the second base plate 6102.

The composite layer 620 (referring to FIG. 21) or the bonding layer 660 (referring to FIG. 22) can be arranged on one side of the first base plate 6101 opposite to the third base plate 6103, and the fixing layer 680 can be arranged on one side of the second base plate 6102 opposite to the third base plate 6103. Alternatively, the composite layer 620 or the bonding layer 660 can be arranged on one side of the second base plate 6102 opposite to the third base plate 6103, and the fixing layer 680 can be arranged on one side of the first base plate 6101 opposite to the third base plate 6103.

In an embodiment, when on each layer of base plate is formed at least one electromagnetic assembly including transformers and wave filters, for example, as shown in FIG. 21 and FIG. 22, on each of the first base plate 6101, the second base plate 6102 and the third base plate 6013 is disposed at least one electromagnetic assembly including transformers and wave filters, the composite layer 620 or the bonding layer 660 can be arranged on the first base plate 6101 or the second base plate 6102.

When the transformer and the wave filter are respectively formed on different base plates, e.g., on some base plates 610 there may only be arranged transformers and on the other base plates 610 there may only be arranged wave filters, because the number of the conductive wire patterns of the wave filter is less than the number of the conductive wire patterns of the transformer, the fixing layer can be disposed on the base plate on which the wave filters are formed, and the composite layer or the bonding layer can be disposed on the base plate on which the transformers are formed. In this way, the structure of the integrated transformer may be more compact.

For example, in one embodiment, as shown in FIG. 21 and FIG. 22, only transformers can be formed on the first base plate 6101, and only wave filters can be formed on the second base plate 6102. On the third base plate 6103 there may be formed only transformers, only wave filters, or both transformers and wave filters. Then, in order to make the structure of the integrated transformer more compact, the composite layer 620 or the bonding layer 660 can be disposed on one side of the first base plate 6101 on which the transformers are formed and opposite to the second base plate 6102, and the fixing layer 680 can be disposed on one side of the second base plate 6102 on which the wave filters are formed and opposite to the third base plate 6103. In the above embodiment, electronic components may be directly attached on the bonding layer which is arranged in a same layer as the transmission layer, or be arranged on one side of the composite layer which is located on the transmission layer and opposite to the base plate. This configuration may, on the one hand, simplify production and processing steps and improve product yield, on the other hand, increase the level of integration of the electromagnetic device and make it more convenient for use.

The present disclosure further provides an electronic device. The electronic device can include an electromagnetic device. The electromagnetic device can include at least one of the above described transformer, integrated transformer, electromagnetic element or electromagnetic device.

It could be understood that, one skilled in the art may make any equivalence or modification based on the technical solution and the inventive concept of the present disclosure. All these modifications and equivalencies shall all be covered within the protection claimed in the claims of the present disclosure.

What is claimed is:

1. An electromagnetic device, comprising:
a base plate comprising:
   a central part defining a plurality of inner via holes each running through the base plate; and
   a peripheral part defining a plurality of outer via holes each running through the base plate;
   wherein an annular accommodating groove is defined between the central part and the peripheral part;
a magnetic core received in the annular accommodating groove;
a plurality of transmission units, wherein on each side of the base plate is arranged at least one of the plurality of transmission units, and each of the plurality of transmission units comprises:
   a transmission wire layer comprising a plurality of conductive wire patterns, wherein the plurality of conductive wire patterns are spaced apart and arranged along a circumferential direction of the annular accommodating groove, each of the plurality of conductive wire patterns bridges one of the plurality of inner via holes and a corresponding one of the plurality of outer via holes; and
   a connection layer disposed on a side of the transmission wire layer close to the base plate, and configured to fix the transmission wire layer; and
a plurality of conductive parts set within the plurality of inner via holes and the plurality of outer via holes, and configured to connect the plurality of conductive wire patterns of the plurality of transmission units on two sides of the base plate so as to form a coil circuit capable of transmitting current around the magnetic core;
wherein a dielectric loss of the connection layer of at least one of the plurality of transmission units is less than or equal to 0.02.

2. The electromagnetic device of claim 1, wherein
on one side of the base plate is arranged a first one of the plurality of transmission units, and on an opposite side of the base plate is arranged a second one of the plurality of transmission units;
a dielectric loss of the connection layer of at least one of the first one or the second one of the plurality of transmission units is less than or equal to 0.02.

3. The electromagnetic device of claim 1, wherein
on one side of the base plate is arranged a first one of the plurality of transmission units, and on an opposite side of the base plate are arranged a second one and a third one of the plurality of transmission units which are stacked together;
the third one of the plurality of transmission units is disposed on a side of the second one of the plurality of transmission units away from the base plate, and a dielectric loss of the connection layer of the third one of the plurality of transmission units is less than or equal to 0.02.

4. The electromagnetic device of claim 1, wherein
the plurality of inner via holes comprise a plurality of first inner via holes and a plurality of second inner via holes; and
a distance between each of the plurality of first inner via holes and a center of the central part is smaller than a distance between each of the plurality of second inner via holes and the center of the central part.

5. The electromagnetic device of claim 4, wherein
the plurality of first inner via holes comprise a plurality of first sub inner via holes and a plurality of second sub inner via holes; and
a distance between each of the plurality of first sub inner via holes and the center of the central part is smaller than a distance between each of the plurality of second sub inner via holes and the center of the central part.

6. The electromagnetic device of claim 4, wherein
distances between each of the plurality of first inner via holes and two adjacent ones of the plurality of second inner via holes are identical.

7. The electromagnetic device of claim 1, wherein
the plurality of conductive wire patterns of all the plurality of transmission units are divided into a plurality of input line groups and a plurality of coupling line groups, the conductive wire patterns of the plurality of input line groups are input lines, and the conductive wire patterns of the plurality of coupling line groups are coupling lines;
each of the plurality of input line groups comprises at least one of the input lines, and each of the plurality of coupling line groups comprises at least one of the coupling lines.

8. The electromagnetic device of claim 7, wherein
the plurality of transmission units comprise a first transmission unit and a second transmission unit respectively located on two opposite sides of the base plate;
the plurality of input line groups and the plurality of coupling line groups are respectively included in both of the first transmission unit and the second transmission unit; and
the plurality of input line groups and the plurality of coupling line groups are alternately arranged along a circumferential direction of the magnetic core.

9. The electromagnetic device of claim 7, wherein
the plurality of transmission units comprise two first transmission units located on one side of the base plate and two second transmission units located on an opposite side of the base plate;
the plurality of input line groups are included in one of the two first transmission units and one of the two second transmission units; and
the plurality of coupling line groups are included in the other of the two first transmission units and the other of the two second transmission units.

10. The electromagnetic device of claim 9, wherein
a projection of the plurality of input line groups on the base plate and a projection of the plurality of coupling line groups on the base plate are alternately arranged along the circumferential direction of the annular accommodating groove.

11. The electromagnetic device of the claim 9, wherein
a projection of the plurality of input line groups on the base plate and a projection of the plurality of coupling line groups on the base plate are overlapped.

12. The electromagnetic device of claim 1, wherein a thickness of the transmission wire layer is from 17 µm to 102 µm.

13. An electromagnetic device, comprising:
a base plate comprising:
   a central part defining a plurality of inner via holes passing therethrough; and
   a peripheral part defining a plurality of outer via holes passing therethrough;
   wherein an annular accommodating groove is defined between the central part and the peripheral part;
a magnetic core received in the annular accommodating groove;
a plurality of conductive parts set respectively within the plurality of inner via holes and the plurality of outer via holes;
two input line layers disposed on two opposite sides of the base plate, wherein the two input lines comprises a plurality of input lines connected in order by corresponding ones of the plurality of conductive parts to form an input coil around the magnetic core;
two coupling line layers disposed on the two opposite sides of the base plate, wherein the two coupling line layers comprises a plurality of coupling lines connected in order by corresponding ones of the plurality of conductive parts to form a coupling coil around the magnetic core; and
two first connection layers each set between a respective one of the two input line layers and a respective one of the two coupling line layers, wherein a dielectric loss of each of the two first connection layers is no more than 0.02;
wherein
the two input line layers are located farther from the base plate compared with the two coupling line layers, or, the two input line layers are located closer to the base plate compared with the two coupling line layers; and
the respective one of the two input line layers and the respective one of the two coupling line layers are attached together by a respective one of the two first connection layers.

14. The electromagnetic device of claim 13, further comprising:
two second connection layers attached on surfaces of the two opposite sides of the base plate;
wherein each of the two second connection layers is configured to fix the respective one of the two input line layers or the two coupling line layers, and a dielectric loss of each of the two second connection layers is no more than 0.02.

15. The electromagnetic device of claim 13, wherein
the plurality of inner via holes comprise a plurality of first inner via holes and a plurality of second inner via holes; and
a distance between each of the plurality of first inner via holes and a center of the central part is smaller than a distance between each of the plurality of second inner via holes and the center of the central part.

16. The electromagnetic device of claim 15, wherein
distances between each of the plurality of first inner via holes and two adjacent ones of the plurality of second inner via holes are identical.

17. The electromagnetic device of claim 13, wherein
a projection of the plurality of input lines on the base plate and a projection of the plurality of coupling lines on the base plate are staggered.

18. The electromagnetic device of claim 13, wherein
a projection of the plurality of input lines on the base plate and a projection of the plurality of coupling lines on the base plate are overlapped.

19. The electromagnetic device of claim 13, wherein a thickness of each of the plurality of input lines or the plurality of coupling lines is from 17 μm to 102 μm.

20. A method for manufacturing an electromagnetic device, comprising:
providing a base plate, and defining an annular accommodating groove on the base plate to divide the base plate into a central part and a peripheral part;
embedding a magnetic core into the annular accommodating groove;
forming two connection layers respectively on two opposite sides of the base plate, wherein a dielectric loss of at least one of the two connection layers is no more than 0.02;
attaching two conductive plates respectively on the two connection layers;
forming a plurality of inner via holes corresponding to a location of the central part and forming a plurality of outer via holes corresponding to a location of the peripheral part, wherein each of the plurality of inner via holes and the plurality of outer via holes each passes through the base plate, the two connection layers and the two conductive plates; and
transforming the two conductive plates into transmission wire layers comprising a plurality of transmission wire patterns, and forming a plurality of conductive parts respectively in the plurality of inner via holes and the plurality of outer via holes, wherein the plurality of transmission wire patterns are connected in order by the plurality of conductive parts to form a coil circuit capable of transmitting current around the magnetic core.

* * * * *